United States Patent
Koyama

(10) Patent No.: US 7,663,473 B2
(45) Date of Patent: Feb. 16, 2010

(54) SEMICONDUCTOR DEVICE, IC CARD, IC TAG, RFID, TRANSPONDER, BILLS, SECURITIES, PASSPORT, ELECTRONIC APPARATUS, BAG, AND CLOTHES

(75) Inventor: Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 914 days.

(21) Appl. No.: 11/044,862

(22) Filed: Jan. 28, 2005

(65) Prior Publication Data

US 2005/0180187 A1 Aug. 18, 2005

(30) Foreign Application Priority Data

Feb. 12, 2004 (JP) ............................. 2004-034845

(51) Int. Cl.
*H04Q 5/22* (2006.01)
*G08B 13/14* (2006.01)

(52) U.S. Cl. ............. 340/10.1; 340/10.34; 340/572.1; 340/572.7; 365/100; 235/494

(58) Field of Classification Search ............ 340/10.1, 340/10.34, 572.7, 572.1; 365/100, 185.05, 365/185.04, 185.28; 363/30; 235/494, 492; 327/536, 535; 345/212; 257/324

See application file for complete search history.

(56) References Cited

U.S. PATENT DOCUMENTS

| | | | |
|---|---|---|---|
| 4,922,319 A | | 5/1990 | Fukushima |
| 5,523,974 A | | 6/1996 | Hirano et al. |
| 5,532,181 A | * | 7/1996 | Takebuchi et al. ............ 438/258 |
| 5,736,728 A | | 4/1998 | Matsubara |
| 5,999,445 A | * | 12/1999 | Rolandi et al. ......... 365/185.03 |
| 6,003,777 A | * | 12/1999 | Kowalski ..................... 235/492 |
| 6,070,804 A | * | 6/2000 | Miyamoto .................. 235/494 |
| 6,079,622 A | * | 6/2000 | Goto ........................... 235/492 |
| 6,190,951 B1 | | 2/2001 | Nakahori et al. |
| 6,483,745 B2 | * | 11/2002 | Saeki ..................... 365/185.04 |
| 6,509,217 B1 | * | 1/2003 | Reddy ......................... 438/153 |
| 6,509,602 B2 | * | 1/2003 | Yamazaki et al. ........... 257/314 |
| 6,525,595 B2 | * | 2/2003 | Oku ............................ 327/536 |
| 6,567,313 B2 | * | 5/2003 | Tanaka et al. .......... 365/185.28 |
| 6,756,640 B2 | * | 6/2004 | Yamazaki et al. ........... 257/347 |

(Continued)

FOREIGN PATENT DOCUMENTS

| | | |
|---|---|---|
| JP | 2000-242754 | 9/2000 |
| JP | 2001-250393 | 9/2001 |

OTHER PUBLICATIONS

Office Action (Application No. 200510009026.3) dated Jun. 27, 2008.

*Primary Examiner*—Brian A Zimmerman
*Assistant Examiner*—Nam V Nguyen
(74) *Attorney, Agent, or Firm*—Eric J. Robinson; Robinson Intellectual Property Law Office, P.C.

(57) ABSTRACT

A contactless ID chip to which a signal is inputted from an antenna by a wireless means, where data can be written only once. In the contactless ID chip having a nonvolatile EEPROM, data indicating whether writing is performed to the EEPROM is written simultaneously with basic data writing, and once writing is performed to the EEPROM, other data cannot be written thereto.

42 Claims, 29 Drawing Sheets

U.S. PATENT DOCUMENTS

| | | | |
|---|---|---|---|
| 6,768,680 B2 * | 7/2004 | Kato | 365/185.22 |
| 6,787,806 B1 | 9/2004 | Yamazaki et al. | |
| 6,954,084 B2 | 10/2005 | Islam | |
| 6,972,662 B1 * | 12/2005 | Ohkawa et al. | 340/10.1 |
| 7,115,941 B2 * | 10/2006 | Kato | 257/316 |
| 2002/0113268 A1 | 8/2002 | Koyama et al. | |
| 2004/0150468 A1 | 8/2004 | Shimizu et al. | |
| 2005/0174845 A1 | 8/2005 | Koyama et al. | |
| 2006/0054707 A1 | 3/2006 | Akita et al. | |
| 2007/0171693 A1 | 7/2007 | Koyama | |

\* cited by examiner

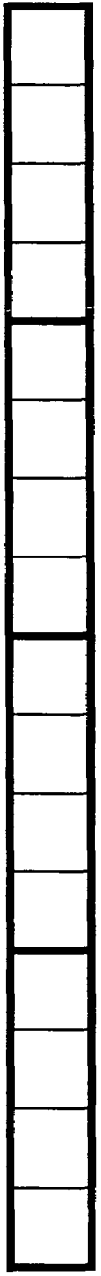
Fig. 12A
Fig. 12B

SEMICONDUCTOR DEVICE, IC CARD, IC TAG, RFID, TRANSPONDER, BILLS, SECURITIES, PASSPORT, ELECTRONIC APPARATUS, BAG, AND CLOTHES

BACKGROUND OF THE INVENTION

1. Field of the Invention

The present invention relates to a semiconductor device used as an IC chip (hereinafter also referred to as an ID chip) that is capable of storing required data in a memory circuit or reading required data by a contactless means such as wireless communication. In particular, the invention relates to a semiconductor device used as an ID chip formed over an insulating substrate such as glass and plastic.

2. Description of the Related Art

With the development and improvement of computer technologies and image recognition technologies, data identification utilizing media such as bar codes has been widely used for identification of product data and the like. It is expected that a larger amount of data is to be identified in the future. On the other hand, data identification utilizing bar codes is disadvantageous in that a bar code reader is required to be in contact with bar codes, and the amount of data stored in bar codes cannot be increased so much. Therefore, contactless data identification and increase in the storage capacity of media are required.

In view of the foregoing, an ID chip using an IC has been developed in recent years. In the ID chip, required data is stored in a memory circuit of an IC chip and the data is read by a contactless means, generally by a wireless means. It is expected that practical application of such an ID chip allows commercial distribution to be simplified and reduced in cost while maintaining high security.

An identification system using an ID chip is briefly described with reference to FIG. 4. FIG. 4 is a schematic view showing an identification system for wirelessly obtaining identification data of a bag. An ID chip 401 storing specific identification data is mounted on or inside a bag 404. Radio waves are transmitted from an antenna unit 402 of an interrogator (also called a reader/writer) 403 to the ID chip 401. When receiving the radio waves, the ID chip 401 sends its own identification data back to the antenna unit 402. The antenna unit 402 transmits the received identification data to the interrogator 403, and the interrogator 403 determines the identification data. In this manner, the interrogator 403 can obtain the data of the bag 404. Such a system enables distribution management, tabulation, prevention of counterfeit goods, and the like.

The ID chip has, for example, a configuration shown in FIG. 2. A semiconductor device 200 used as an ID chip includes an antenna circuit 201, a rectification circuit 202, a stabilizing power supply circuit 203, an amplifier 208, a demodulation circuit 213, a logic circuit 209, a memory control circuit 212, a memory circuit 211, a logic circuit 207, an amplifier 206, and a modulation circuit 205. The antenna circuit 201 includes an antenna coil 301 and a tuning capacitor 302 (FIG. 3A). The rectification circuit 202 includes diodes 303 and 304, and a smoothing capacitor 305 (FIG. 3B).

The operation of such an ID chip is described hereinafter. An AC signal received by the antenna circuit 201 is half-wave rectified by the diodes 303 and 304, and then smoothed by the smoothing capacitor 305. The smoothed voltage, which has many ripples, is stabilized by the stabilizing power supply circuit 203, and the stabilized voltage is supplied to the demodulation circuit 213, the amplifier 206, the logic circuit 207, the amplifier 208, the logic circuit 209, the memory circuit 211, and the memory control circuit 212. Meanwhile, a signal received by the antenna circuit 201 is inputted as a clock signal to the logic circuit 209 through the amplifier 208. A signal inputted from the antenna 301 is demodulated in the demodulation circuit 213, and inputted as data to the logic circuit 209.

The data inputted to the logic circuit 209 is decoded. Since the interrogator encodes data by deformable mirror code, NRZ-L code or the like, the logic circuit 209 decodes the data. The decoded data is transmitted to the memory control circuit 212, thereby memory data stored in the memory circuit 211 is read. The memory circuit 211 is required to be a nonvolatile memory circuit such as a mask ROM, which is capable of storing data even when a power supply is turned off. The memory circuit 211 stores, for example, 16-byte data having 4-byte family code, 4-byte application code, and two kinds of 4-byte user code set by users (see FIG. 12A).

The frequency of a transmitted and received signal is 125 kHz, 13.56 MHz, 915 MHz, or 2.45 GHz each having an ISO standard and the like. In addition, modulation and demodulation systems for transmitting and receiving signals are also standardized. An example of such an ID chip is disclosed in Patent Document 1.

[Patent Document 1] Japanese Patent Laid-Open No. 2001-250393

The aforementioned conventional semiconductor device for an ID chip has the following problems. In the case of a mask ROM being used as a memory circuit, data cannot be written except in the manufacture of a chip. Thus, an ID chip where data can be written except in the manufacture of the chip is required.

Meanwhile, in the case of an EEPROM being used as a memory circuit, user can rewrite data freely. However, at the same time, anyone other than the user can change data for identification that is not to be rewritten, which allows counterfeiting. Thus, an ID chip where data can be written only once is required to prevent such counterfeiting.

SUMMARY OF THE INVENTION

In view of the foregoing, the invention provides a semiconductor device used as an ID chip where data can be written only once. The invention further provides a semiconductor device used as an ID chip where data can be written except in the manufacture of the chip.

A semiconductor device of the invention comprises a modulation circuit, a demodulation circuit, a logic circuit, and a memory circuit that are formed over an insulating substrate, wherein the modulation circuit and the demodulation circuit are electrically connected to an antenna circuit, the demodulation circuit is connected to the logic circuit, the memory circuit stores an output signal of the logic circuit, the memory circuit is a nonvolatile memory circuit for storing data by charge injection, and a control circuit capable of writing data to the memory circuit only once is provided.

A semiconductor device of the invention comprises a modulation circuit, a demodulation circuit, a logic circuit, and a memory circuit that are formed over an insulating substrate, wherein the modulation circuit and the demodulation circuit are electrically connected to an antenna circuit, the demodulation circuit is connected to the logic circuit, the memory circuit stores an output signal of the logic circuit, the memory circuit is a nonvolatile memory circuit for storing data by charge injection, and the logic circuit controls whether data can be written to the memory circuit or not depending on the data stored in the memory circuit.

In such a semiconductor device of the invention, an element constituting the nonvolatile memory circuit stores data by charge injection into a floating gate.

In such a semiconductor device of the invention, an element constituting the nonvolatile memory circuit stores data by charge injection into a gate insulating film.

In such a semiconductor device of the invention, a power supply used by the nonvolatile memory circuit for storing data is obtained by rectifying and boosting a signal outputted from the antenna circuit.

In such a semiconductor device of the invention, a power supply used by the nonvolatile memory circuit for storing data is obtained from an external high voltage power supply.

In such a semiconductor device of the invention, at least one of the modulation circuit, the demodulation circuit, the logic circuit, and the memory circuit is constituted by a thin film transistor (hereinafter referred to as a TFT).

In such a semiconductor device of the invention, the antenna circuit, the modulation circuit, the demodulation circuit, the logic circuit, and the memory circuit are integrally formed over the same insulating substrate, or the modulation circuit, the demodulation circuit, the logic circuit, and the memory circuit are integrally formed over the same insulating substrate while the antenna circuit is formed on another insulating substrate.

In such a semiconductor device of the invention, the insulating substrate is formed of glass, plastic, or a film insulator.

In such a semiconductor device of the invention, the antenna circuit is formed over at least one of the modulation circuit, the demodulation circuit, the logic circuit, and the memory circuit.

In such a semiconductor device of the invention, a signal inputted to the antenna circuit is a radio signal.

In the invention, the ID chip means a semiconductor chip used for identification, which is used as an IC tag, a wireless tag, an RFID, an IC card, a transponder and the like.

As set forth above, according to the invention, data can be written to a memory circuit in an ID chip only once. As a result, counterfeiting of data of the ID chip can be prevented, and a semiconductor device used as the ID chip with high security can be achieved. In addition, the invention can provide a semiconductor device used as an ID chip capable of writing data except in the manufacture of the chip.

BRIEF DESCRIPTION OF THE DRAWINGS

FIGS. 12A and 12B are diagrams showing examples of data stored in a memory circuit.

DETAILED DESCRIPTION OF THE INVENTION

Figure 1:
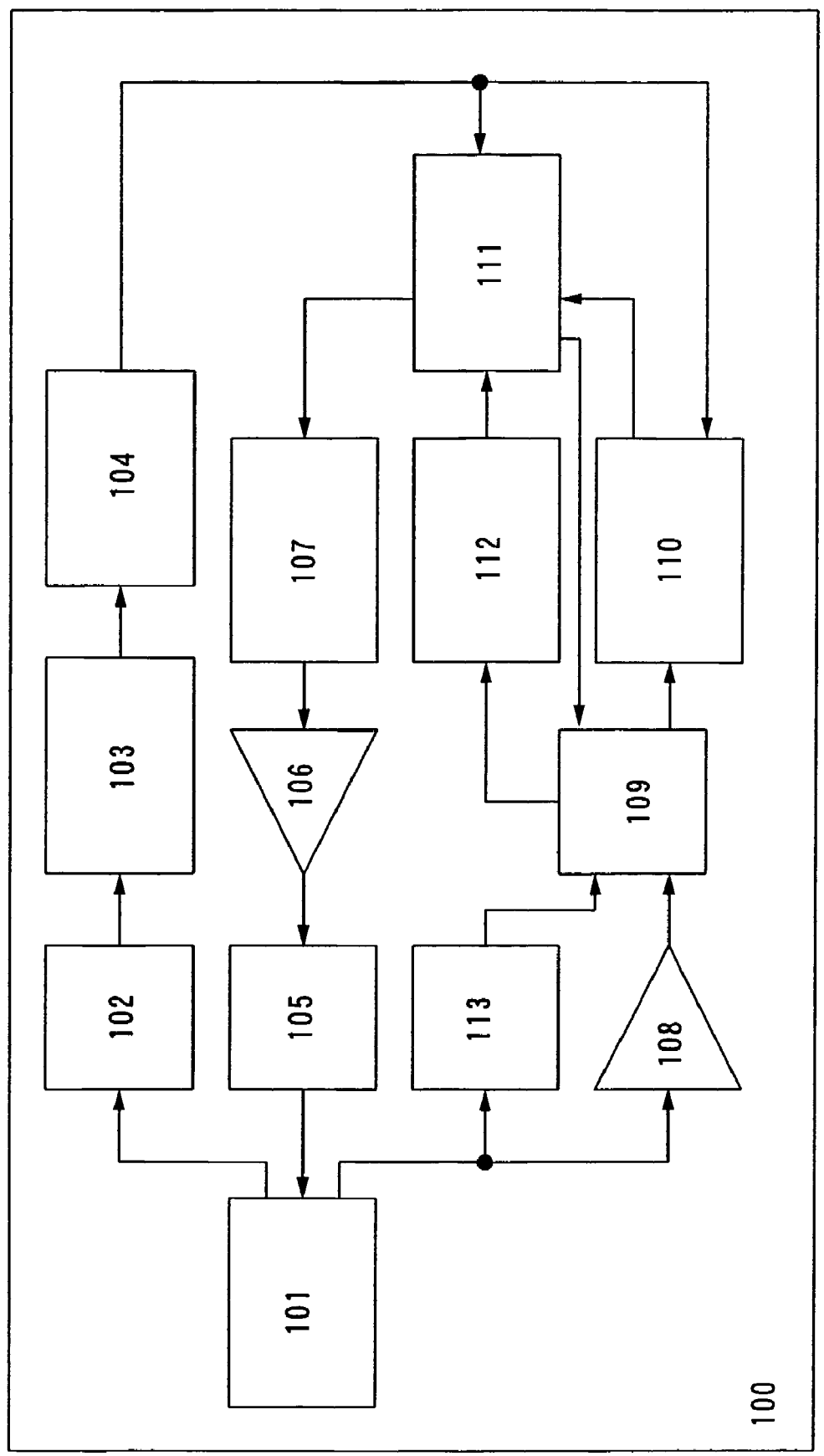
FIG. 1 is a block diagram showing a configuration of a semiconductor device of the invention.
Figure 2:
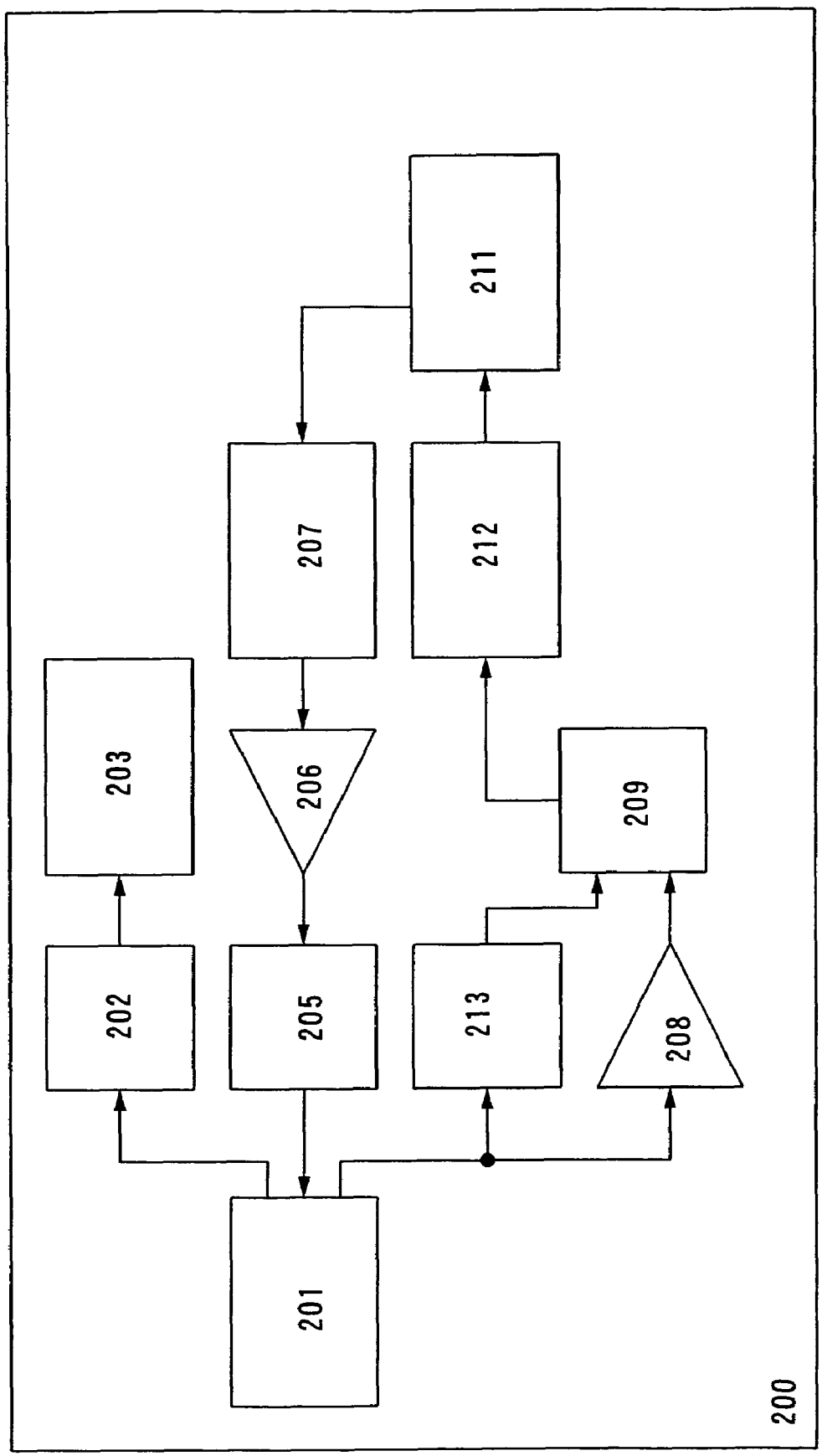
FIG. 2 is a block diagram showing a configuration of a conventional semiconductor device.

Although the invention will be described by way of Embodiment Mode and Embodiments with reference to the accompanying drawings, it is to be understood that various changes and modifications will be apparent to those skilled in the art. Therefore, unless such changes and modifications depart from the scope of the invention, they should be constructed as being included therein. Note that the identical portions or portions having the same function are denoted by the same reference numerals in all the drawings, and will be described in no more detail.

Figure 3A:
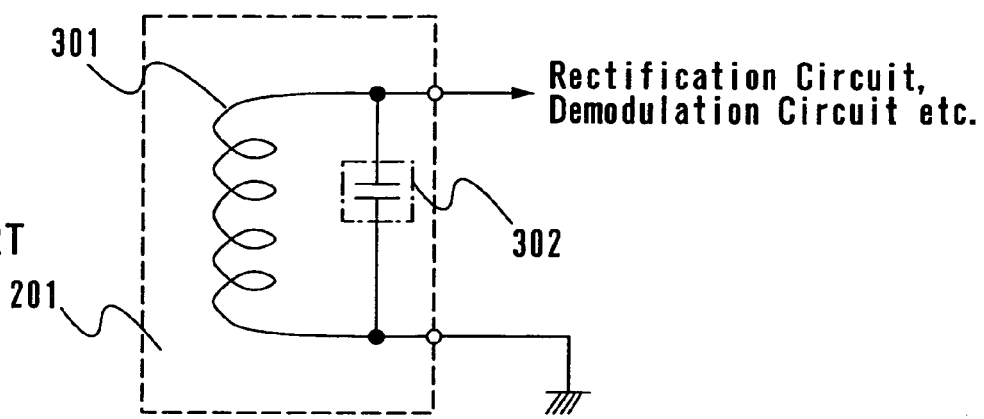
FIGS. 3A and 3B are block diagrams each showing a configuration of a conventional semiconductor device.
Figure 3B:
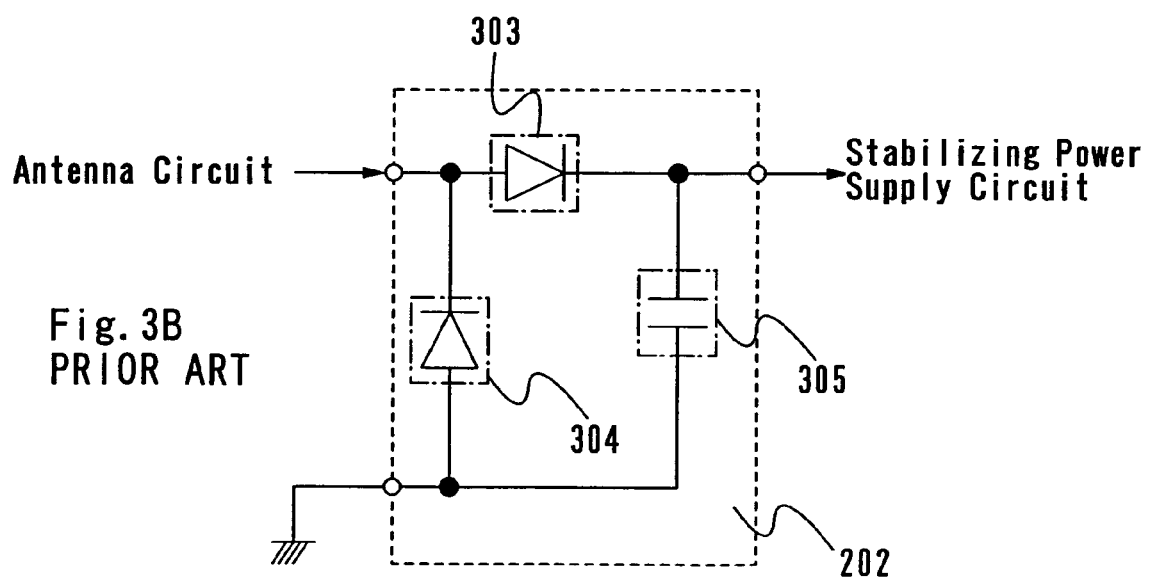
Figure 4:
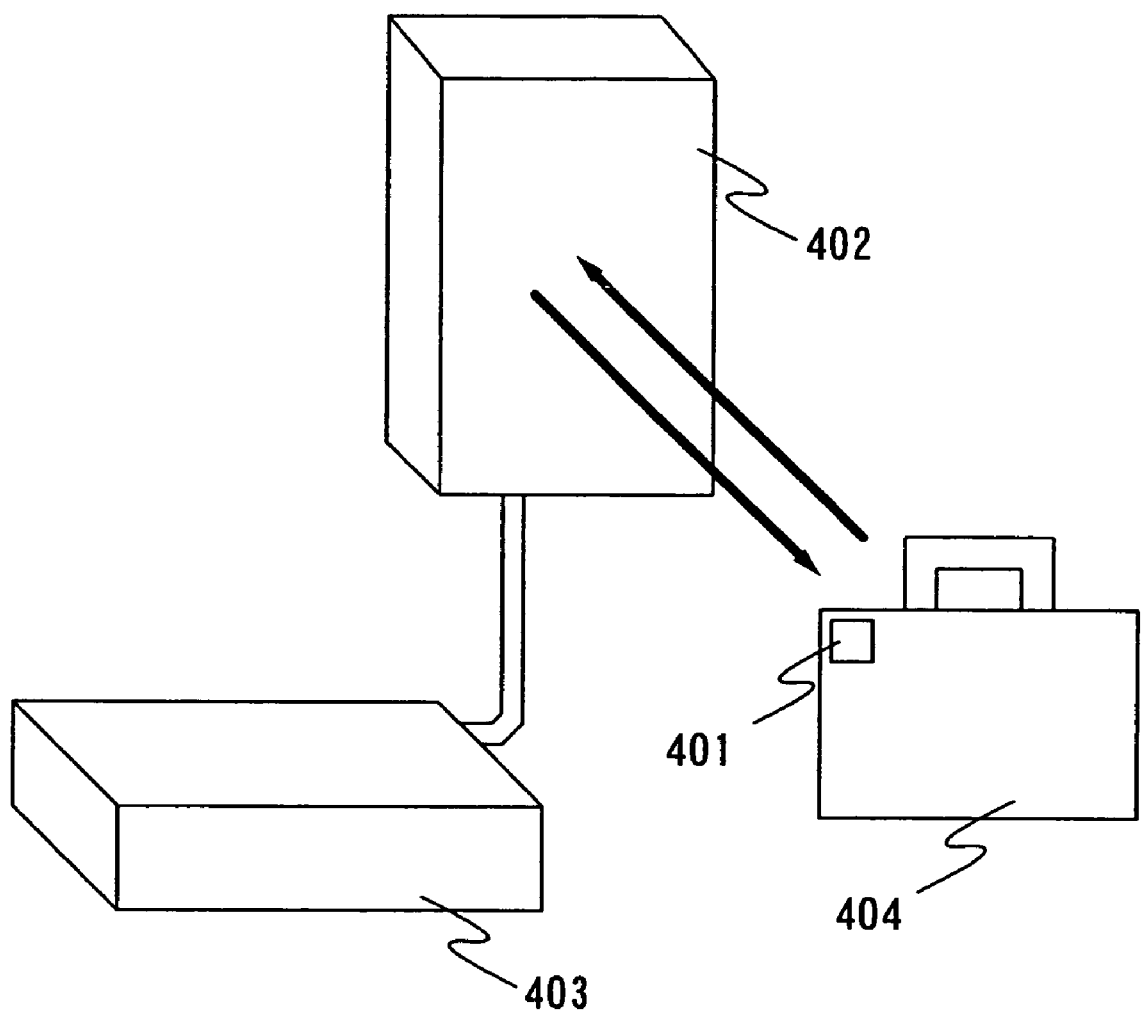
FIG. 4 is a schematic view showing an RF tag system.

A semiconductor device of the invention is described. In FIG. 1, a semiconductor device 100 used as an ID chip includes an antenna circuit 101, a rectification circuit 102, a stabilizing power supply circuit 103, a boosting power supply circuit 104, a modulation circuit 105, an amplifier 106, a logic circuit 107, an amplifier 108, a logic circuit 109, a level shift circuit 110, a nonvolatile memory circuit 111, a nonvolatile memory control circuit 112, and a demodulation circuit 113. The antenna circuit 101 is similar to the conventional one shown in FIG. 3A, and the rectification circuit 102 is similar to the conventional one shown in FIG. 3B. Although the antenna circuit 101 is formed over the semiconductor device 100 in this embodiment mode, the invention is not limited to this and the antenna circuit 101 may be connected externally to the semiconductor device 100.

The operation of such an ID chip is described hereinafter. An AC signal received by the antenna circuit 101 is rectified by the rectification circuit 102 to be smoothed. The smoothed voltage, which has many ripples, is stabilized by the stabilizing power supply circuit 103, and the stabilized voltage is supplied to the boosting power supply circuit 104, the amplifier 106, the logic circuit 107, the amplifier 108, and the logic circuit 109.

In the case of writing data to the nonvolatile memory circuit 111, an output voltage of the stabilizing power supply circuit 103 is boosted by the boosting power supply circuit 104, and data is written to the nonvolatile memory circuit 111 using the boosted voltage. A charge pump circuit or the like is used as the boosting power supply circuit 104, though the invention is not limited to this. A clock signal for driving the boosting power supply circuit 104 may be generated using an AC signal inputted from the antenna circuit 101, or may be generated by an oscillation circuit provided in the semiconductor device 100.

A signal inputted from the antenna circuit 101 is operated by the logic circuit 109, and then inputted to the level shift circuit 110. The level shift circuit 110 operates at a voltage boosted by the boosting power supply circuit 104, and has a function of amplifying a signal amplitude of the logic circuit 109. The logic circuit 109 specifies whether to write to the nonvolatile memory control circuit 112, an address thereof and the like. The nonvolatile memory circuit 111 writes data in accordance with the instruction of the nonvolatile memory control circuit 112 and the level shift circuit 110.

When an interrogator calls up data stored in the nonvolatile memory circuit 111, the following operation is performed. An AC signal received by the antenna circuit 101 is rectified by the rectification circuit 102 to be smoothed. The smoothed voltage, which has many ripples, is stabilized by the stabilizing power supply circuit 103, and the stabilized voltage is supplied to the boosting power supply circuit 104, the amplifier 106, the logic circuit 107, the amplifier 108, and the logic circuit 109. On the other hand, an AC signal received by the antenna circuit 101 is inputted to the logic circuit 109 through the amplifier 108, and then operated. The nonvolatile memory control circuit 112 is controlled by a signal of the logic circuit 109, thereby data stored in the nonvolatile memory circuit 111 is called up. Subsequently, the data stored in the nonvolatile memory circuit 111 is processed by the logic circuit 107, and the modulation circuit 105 operates in accordance with the output thereof. The data is processed in accordance with standards such as ISO 14443, ISO 15693, and ISO 18000, though other standards may be adopted as long as it is consistent with the interrogator.

When the modulation circuit 105 operates, the impedance of the antenna circuit 101 varies, which causes changes in signals of the interrogator reflected by the antenna circuit 101. By reading these changes, the interrogator can recognize data stored in the nonvolatile memory circuit 111 in the semiconductor device 100. Such a modulation method is called a load modulation method.

Figure 5:
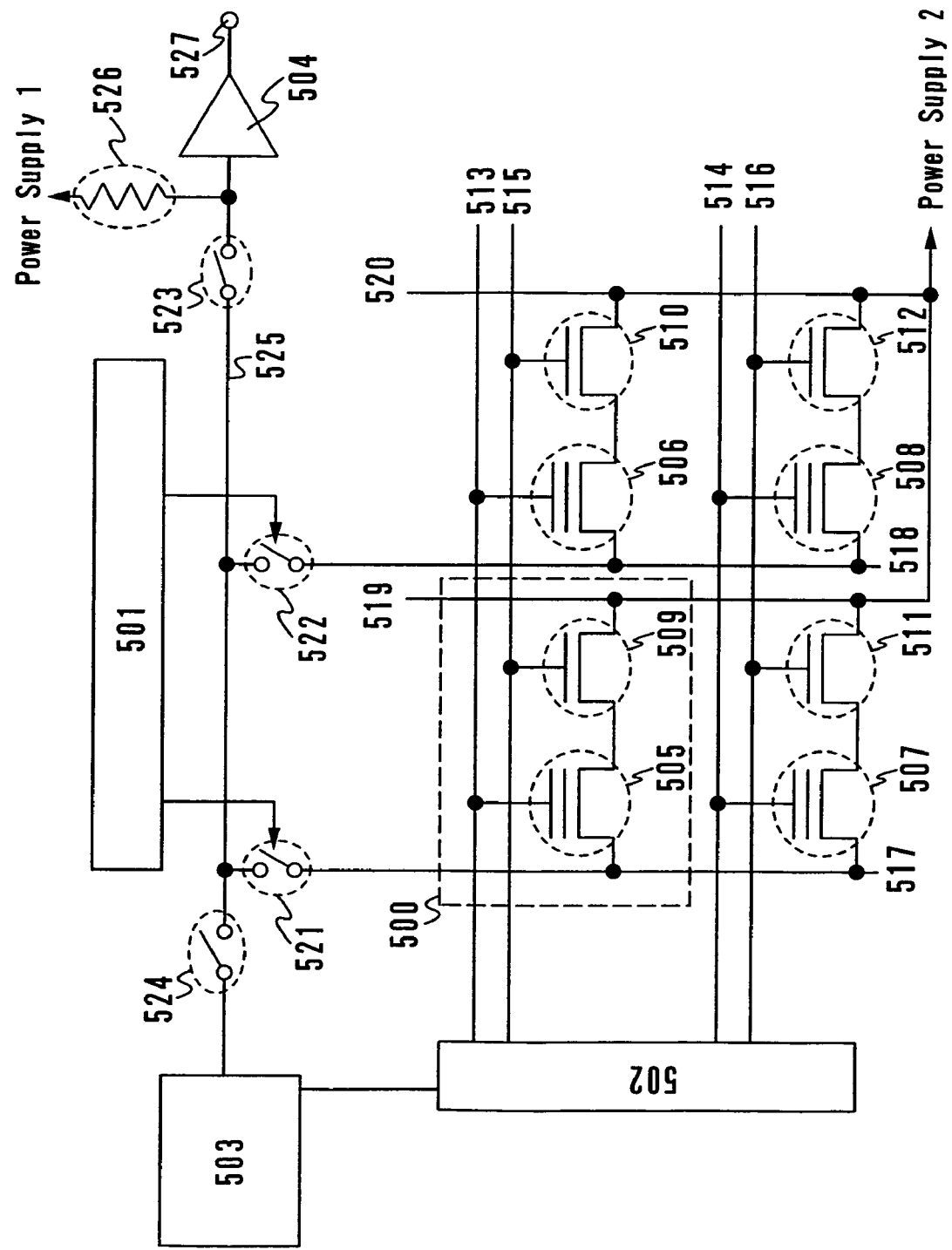
FIG. 5 is a circuit diagram showing an EEPROM.

The operation of the nonvolatile memory circuit is described below with reference to FIG. 5. FIG. 5 shows an example in which an EEPROM circuit is used as the nonvolatile memory circuit. In FIG. 5, a 4-bit memory circuit is shown as the EEPROM circuit for simplicity, though the invention is not limited to the 4-bit memory circuit. The EEPROM circuit shown in FIG. 5 includes a column decoder 501, a row decoder 502, a boosting power supply circuit 503, an amplifier 504, P-channel memory transistors 505 to 508, P-channel switching transistors 509 to 512, bit lines 517 and 518, power supply lines 519 and 520, word lines 513 to 516, an output wiring 525, a memory load resistor 526, an output terminal 527, and power supplies 1 and 2. The power supply 1 sets a low potential whereas the power supply 2 sets a high potential. However, in the case of the transistors 505 to 512 being N-channel transistors, the power supply 1 sets a high potential whereas the power supply 2 sets a low potential. In this embodiment mode, P-channel transistors are used for the transistors 505 to 512, and the power supply 1 is 0 V whereas the power supply 2 is +3 V, though the invention is not limited to this. The transistors 505 to 508 each has a floating gate, and stores data by charge injection into the floating gate. A memory cell 500 constituted by the transistors 505 and 509 is described hereinafter as an example.

Described first is the case of writing data so that the memory cell 500 outputs a high signal. First, the row decoder 502 operates to activate the word line 515, thereby the transistors 509 and 510 are turned on. Then, the column decoder 501 operates to turn on a switch 521, thereby the bit line 517 is connected to the output wiring 525. At this time, a switch 523 is turned off while a switch 524 is turned on. When the switch 524 is turned on, the output wiring 525 is connected to the boosting power supply circuit 503, and applied with a high voltage which is set to −10 V herein. This voltage may be arbitrarily set depending on characteristics of a memory element.

Subsequently, the row decoder 502 operates to activate the word line 513. At this time, a voltage of +20 V is applied to the word line 513. This voltage may be arbitrarily set depending on the element capacity. Since the transistor 509 is on, voltages of +3 V, +20 V and −10 V are applied to the source terminal, the gate terminal and the drain terminal of the transistor 505 respectively. With the gate terminal being applied with a high voltage, charges are injected into the floating gate of the transistor 505, and the threshold value thereof is shifted to the positive side.

In the case of writing data so that the memory cell 500 outputs a low signal, the row decoder 502 operates to activate the word line 515, thereby the transistors 509 and 510 are turned on. Then, the column decoder 501 operates to turn on the switch 521, thereby the bit line 517 is connected to the output wiring 525. At this time, the switch 523 is turned off while the switch 524 is turned on. When the switch 524 is turned on, the output wiring 525 is connected to the boosting power supply circuit 503, and applied with a high voltage which is set to −10 V herein. This voltage may be arbitrarily set depending on characteristics of a memory element. Subsequently, the column decoder 502 operates to activate the word line 513. At this time, voltage of +3 V is applied to the word line 513. Since the transistor 509 is on, voltages of +3 V, +3 V and −10 V are applied to the source terminal, the gate terminal and the drain terminal of the transistor 505 respectively. With the gate terminal not being applied with a high voltage, charges are not injected into the floating gate of the transistor 505, and the initial state is maintained.

Described next is the case of reading data. In the case of reading data of the memory cell 500, the row decoder 502 operates to activate the word line 515, thereby the transistors 509 and 510 are turned on. Then, the column decoder 501 operates to turn on the switch 521, thereby the bit line 517 is connected to the output wiring 525. Further, the switch 523 is turned on, thereby the output wiring 525, the memory load resistor 526 and the amplifier 504 are connected to each other. At this time, the switch 524 is turned off.

The row decoder 502 operates to activate the word line 513. At this time, the potential of the word line 513 is set to +3 V. Since the transistor 509 is on, the source potential, the gate potential and the drain potential of the transistor 505 are +3 V, +3 V, and +3 to 0 V respectively.

In the case where charges are injected into the floating gate of the transistor 505, the transistor 505 is on even when $V_{GS}=0$ is satisfied. Thus, a current flows to the transistor 505 through the memory load resistor 526, thereby the memory cell 500 outputs a high signal.

In the case where charges are not injected into the floating gate of the transistor 505, the transistor 505 is off when VGS=0 is satisfied. Thus, a current does not flow to the transistor 505 through the memory load resistor 526, thereby the memory cell 500 outputs a low signal.

An embodiment mode of writing data only once is now described. In this embodiment mode, as shown in FIG. 12B, one bit indicating a writing state is added to a memory area (16 bytes in FIG. 12B) that is normally required for a memory circuit. The added one bit stores data indicating whether writing is performed or not.

Figure 13:
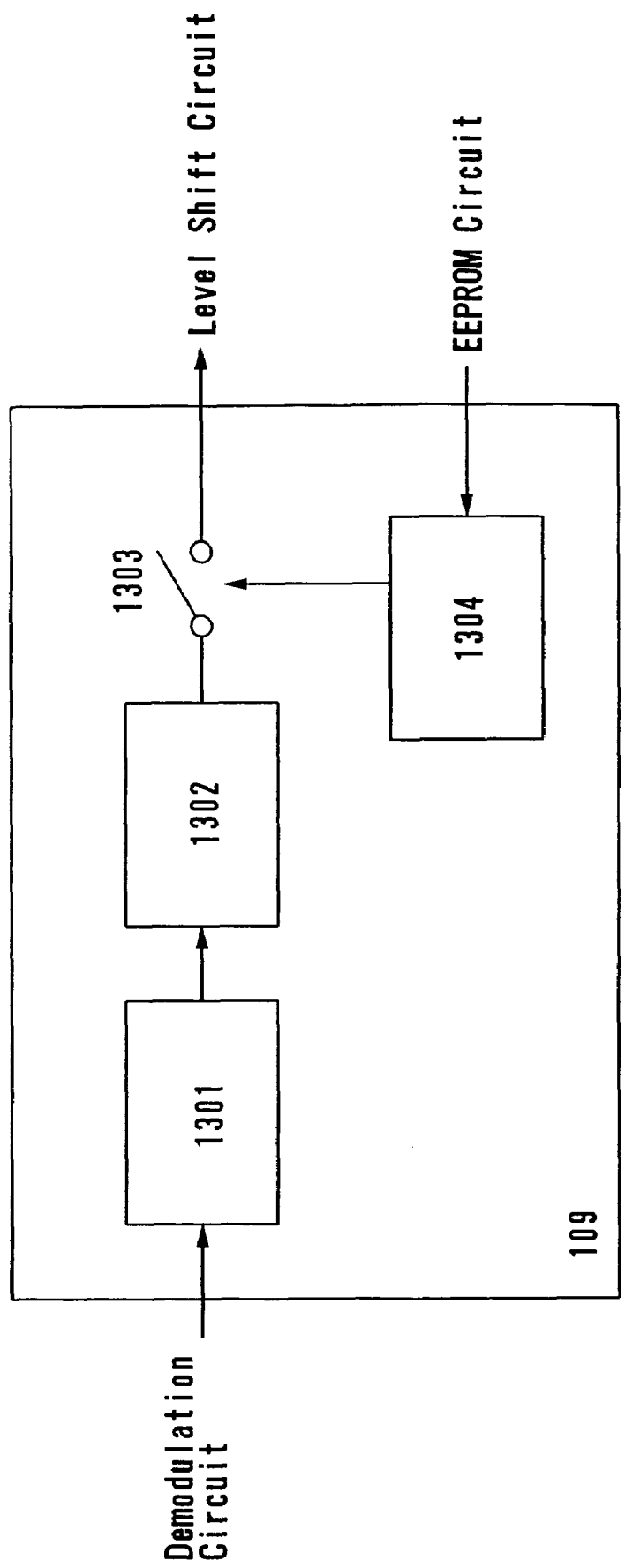
FIG. 13 is a block diagram of a logic circuit of the invention.

The operation thereof is described with reference to FIG. 13. FIG. 13 is a block diagram showing the inside of the logic circuit 109. The logic circuit 109 includes a decode circuit 1301, a delay circuit 1302, a switch 1303, and a volatile memory circuit 1304. In the initial state, the writing state storage bit shown in FIG. 12B indicates a state in which writing is not performed, which is a low state herein (it may be a high state as well). When a signal is inputted from the antenna circuit 101 and the stabilizing power supply is turned on, the nonvolatile memory circuit 111 outputs the signal to the volatile memory circuit 1304 in the logic circuit 109. The volatile memory circuit 1304 stores this signal. A circuit structure of the volatile memory circuit 1304 is not exclusively limited as long as it can store data, and a DRAM, an SRAM, a register or the like may be used.

On the other hand, a signal inputted from the modulation circuit 113 is decoded by the decode circuit 1301, and inputted to the switch 1303 through the delay circuit 1302. The switch 1303 is controlled by the volatile memory circuit 1304, and operates so as to be turned on when data of the volatile memory circuit 1304 is low as described above. In the case of the switch 1303 being on, the signal is outputted to the level shift circuit 110, and written to the nonvolatile memory circuit 111 through the level shift circuit 110. When the writing is completed, a high state is stored in the writing state storage bit shown in FIG. 12B (in the case of the initial value being high, a low state is stored). The delay circuit 1302 prevents data from passing through the switch 1303 and being outputted to the level shift circuit 110 before the stabilizing power supply is turned on and the state of the switch 1303 is determined. Other means than the delay circuit may also be used for preventing errors before the state of the switch 1303 is determined.

When a high state is stored in the writing state storage bit shown in FIG. 12B, the volatile memory circuit 1304 operates so as to turn off the switch 1303. Accordingly, only the first data can pass through the switch 1303, thus the writing data to the memory circuit is limited to once.

Figure 14:
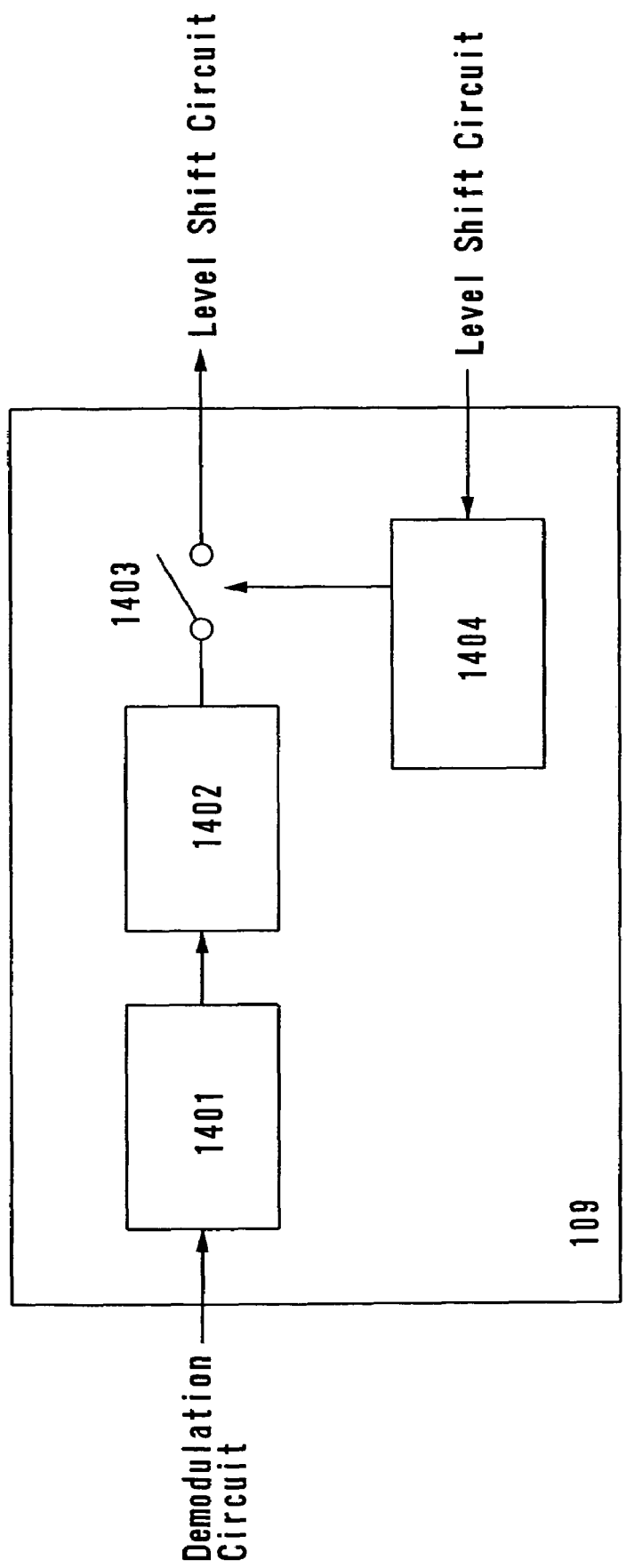
FIG. 14 is a block diagram of a logic circuit of the invention.

An embodiment mode of writing data only once, which is different from the one shown in FIG. 13, is described with reference to FIG. 14. FIG. 14 is a block diagram showing the inside of the logic circuit 109. The logic circuit 109 includes a decode circuit 1401, a delay circuit 1402, a switch 1403, and an EEPROM circuit 1404. The writing state storage bit shown in FIG. 12B is stored in the EEPROM circuit 1401. In the initial state, the writing state storage bit shown in FIG. 12B indicates a state in which writing is not performed, which is a low state herein (it may be a high state as well). When a signal is inputted from the antenna circuit 101 and the stabilizing power supply is turned on, the data is transmitted to the level shift circuit 110 through the decode circuit 1401, the delay circuit 1402 and the switch 1403. After being level shifted by the level shift circuit, 110, the data indicating the writing state is transmitted to the EEPROM 1404 and stored.

On the other hand, a signal inputted from the modulation circuit 113 is decoded by the decode circuit 1401, and inputted to the switch 1403 through the delay circuit 1402. The switch 1403 is controlled by the EEPROM circuit 1404, and operates so as to be turned on when data of the EEPROM circuit 1404 is low as described above. In the case of the switch 1403 being on, the signal is outputted to the level shift circuit 110, and written to the nonvolatile memory circuit 111 through the level shift circuit 110. When the writing is completed, a high state is stored in the writing state storage bit (EEPROM circuit 1404) shown in FIG. 12B (in the case of the initial value being high, a low state is stored). The delay circuit 1402 prevents data from passing through the switch 1403 and being outputted to the level shift circuit 110 before the stabilizing power supply is turned on and the state of the switch 1403 is determined. Other means than the delay circuit may also be used for preventing errors before the state of the switch 1403 is determined.

When a high state is stored in the writing state storage bit shown in FIG. 12B, the EEPROM 1404 operates so as to turn off the switch 1403. Accordingly, only the first data can pass through the switch 1404, thus the writing data to the memory circuit is limited to once.

Embodiment 1

Figure 6A:
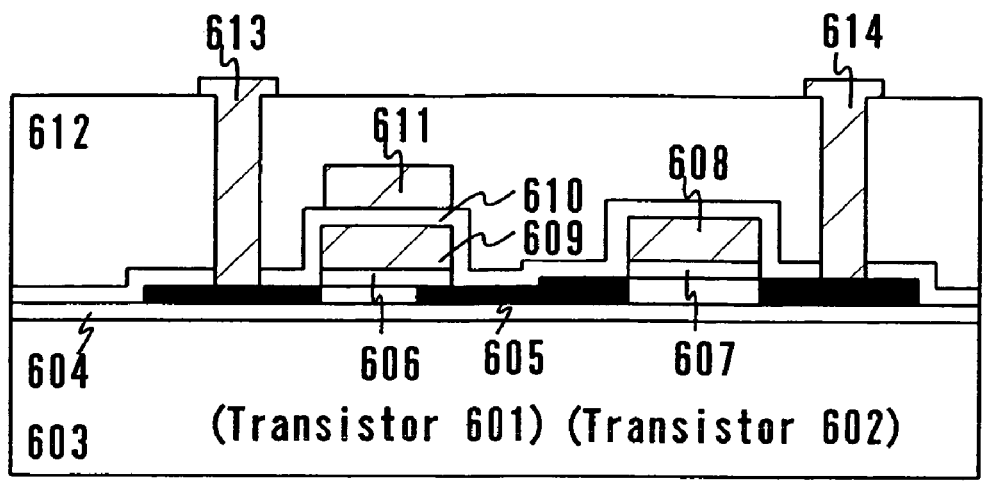
FIGS. 6A and 6B are diagrams showing a configuration of an EEPROM.

FIG. 6A shows an example of an EEPROM element using thin film transistors. In this element, transistors 601 and 602 are connected in series, and a base film 604 is formed over an insulating substrate 603 by using one of a nitride film, a silicon oxynitride film and an oxide film, or a lamination thereof. An island shape silicon region 605 is formed over the base film 604, and first gate insulating films 606 and 607 are formed thereover. A gate electrode 609 is a floating gate of the transistor 601, and a gate electrode 608 is a control gate electrode of the transistor 602. A second gate insulating film 610 is formed over the gate electrodes 608 and 609 to form a control gate electrode of a transistor 611. An interlayer film 612 is formed thereover, and source and drain electrodes 613 and 614 are formed. Such an EEPROM element may be manufactured using a method disclosed in Japanese Patent Laid-Open No. 2001-298100.

Figure 6B:
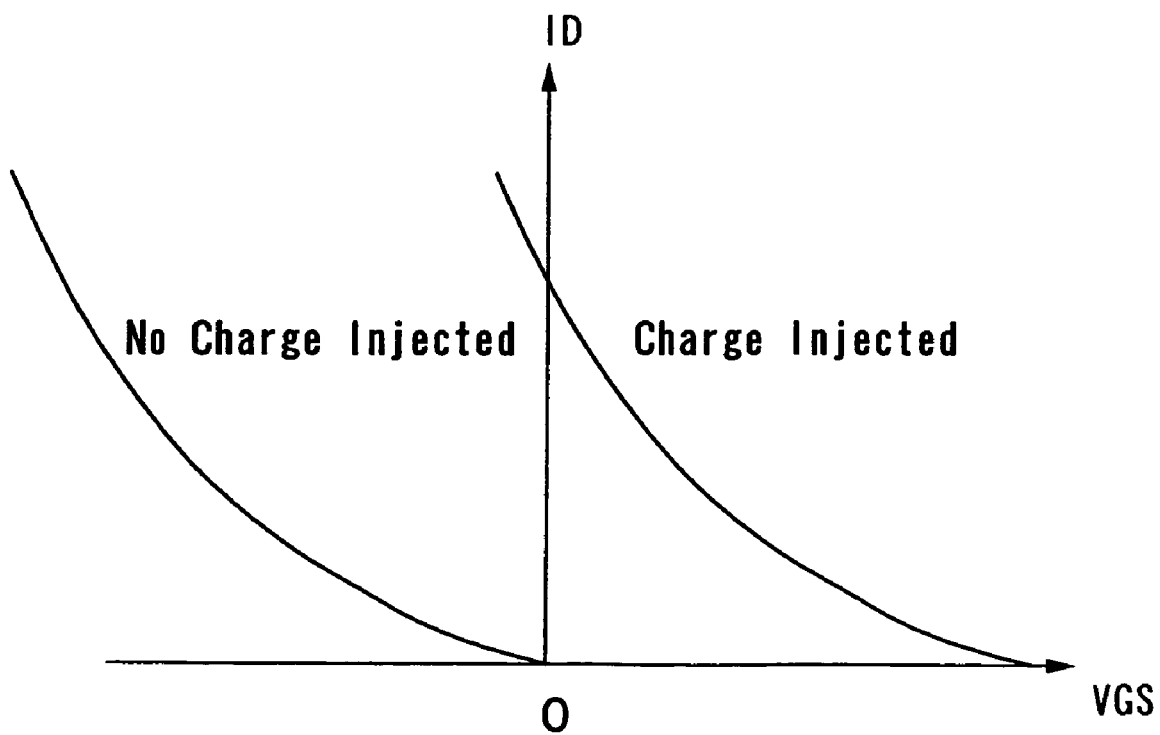

FIG. 6B shows current characteristics of the transistor 601 in the case of charges being injected and not being injected. The storage state can be determined by whether a current flows or not when VGS=0 is satisfied.

Embodiment 2

Figure 7:
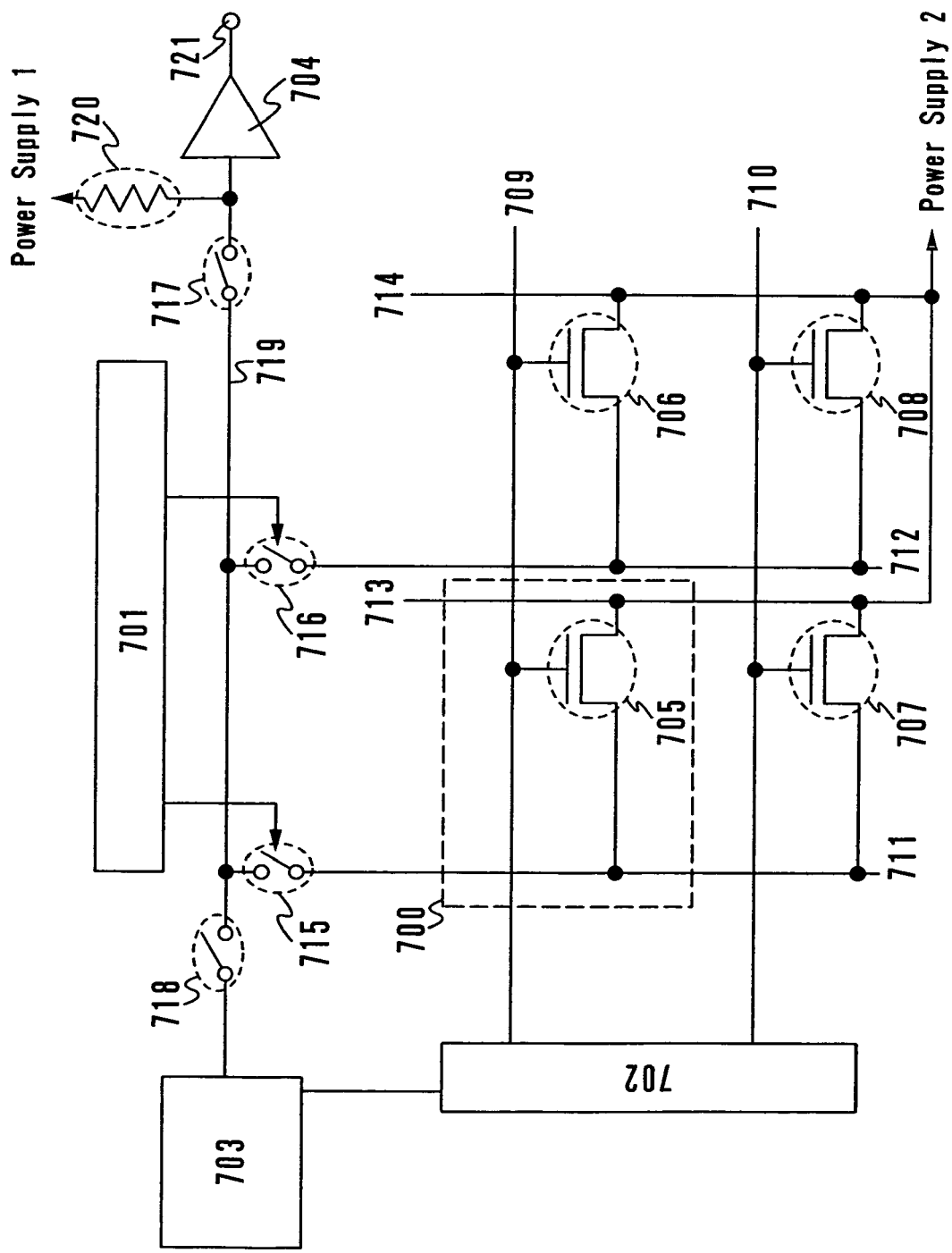
FIG. 7 is a circuit diagram showing a nonvolatile memory using hot carrier degradation.

FIG. 7 shows an embodiment of a nonvolatile memory circuit, which is different from the one described above. The nonvolatile memory circuit shown in FIG. 7 functions as a memory due to hot carrier degradation of TFTs, and in the initial state, it operates as a normal TFT. This nonvolatile memory circuit utilizes the phenomenon that after writing of data, element characteristics degrade and current hardly flows even when a voltage of more than a threshold value is applied to the gate electrode.

The operation of the nonvolatile memory circuit utilizing hot carrier degradation is described hereinafter with reference to FIG. 7. In FIG. 7, a 4-bit memory circuit is shown as the nonvolatile memory circuit for simplicity, though the invention is not limited to the 4-bit memory circuit. The nonvolatile memory circuit in FIG. 7 includes a column decoder 701, a row decoder 702, a boosting power supply circuit 703, an amplifier 704, N-channel transistors 705 to 708, word lines 709 and 710, bit lines 711 and 712, power supply lines 713 and 714, column switches 715 and 716, switches 717 and 718, an output wiring 719, a lord resistor 720, an output terminal 721, and power supplies 1 and 2. A constant current source may be used instead of the load resistor 720.

The power supply 1 sets a high potential whereas the power supply 2 sets a low potential. However, in the case of the transistors 705 to 708 being P-channel transistors, the power supply 1 sets a low potential whereas the power supply 2 sets a high potential. In this embodiment, N-channel transistors are used for the transistors 705 to 708, and the power supply 1 is +3 V whereas the power supply 2 is 0 V, though the invention is not limited to this. A memory cell 700 constituted by the transistor 705 is described hereinafter as an example.

Described first is the case of writing data so that the memory cell 700 outputs a high signal. First, the row decoder 702 operates to activate the word line 709, thereby the transistors 705 and 706 are turned on. Then, the column decoder 701 operates to turn on the column switch 715, thereby the bit line 711 is connected to the output wiring 719. At this time, the switch 717 is turned off while the switch 718 is turned on. When the switch 718 is turned on, the output wiring 719 is connected to the boosting power supply circuit 703, and applied with a high voltage that is set to +20 V herein. This voltage may be arbitrarily set depending on characteristics of a memory element.

Voltages of 0 V, +3 V and +20 V are applied to the source terminal, the gate terminal and the drain terminal of the transistor 705 respectively. Since the drain terminal is applied with a high voltage, charges are injected into the gate insulating film of the transistor 705, leading to hot carrier degradation, and current hardly flows in the case of a drain voltage being low.

In the case of writing data so that the memory cell 700 outputs a low signal, the row decoder 702 operates to activate the word line 709, thereby the transistors 705 and 706 are turned on. Then, the column decoder 701 operates to turn on the column switch 715, thereby the bit line 711 is connected to the output wiring 719. At this time, the switch 717 is turned on while the switch 718 is turned off. When the switch 717 is turned on, the output wiring 719 is connected to the power supply 1 through the load resistor 720, and applied with a power supply voltage that is set to +3 V herein. This voltage may be arbitrarily set depending on characteristics of a memory element. Voltages of 0 V, +3 V and 0 V are applied to the source terminal, the gate terminal and the drain terminal of the transistor 705 respectively. Since the gate terminal and the drain terminal are not applied with a high voltage, charges are not injected into the gate insulating film of the transistor 705, and the initial state is maintained.

Described next is the case of reading data. In the case of reading data of the memory cell 700, the row decoder 702 operates to activate the word line 709, thereby the transistors 705 and 706 are turned on. Then, the column decoder 701 operates to turn on the column switch 715, thereby the bit line 711 is connected to the output wiring 719. Further, the switch 717 is turned on, thereby the output wiring 719, the load resistor 720 and the amplifier 704 are connected to each other. At this time, the switch 718 is turned off.

The row decoder 702 operates to activate the word line 709. At this time, the potential of the word line 709 is set to +3 V. The source potential, the gate potential and the drain potential of the transistor 705 are +3 V, +3 V, and 0 or +3 V respectively.

In the case where charges are injected into the gate insulating film of the transistor 705, a current hardly flows in the transistor 705 even when VGS=+3 V is satisfied. Thus, a current does not flow to the transistor 705 through the load resistor 720, thereby the memory cell 700 outputs a high signal.

In the case where charges are not injected into the gate insulating film of the transistor 705, the transistor 705 is on and a current easily flows thereto when VGS=+3 V is satisfied. Thus, a current flows to the transistor 705 through the load resistor 720, thereby the memory cell 700 outputs a low signal.

Figure 8A:
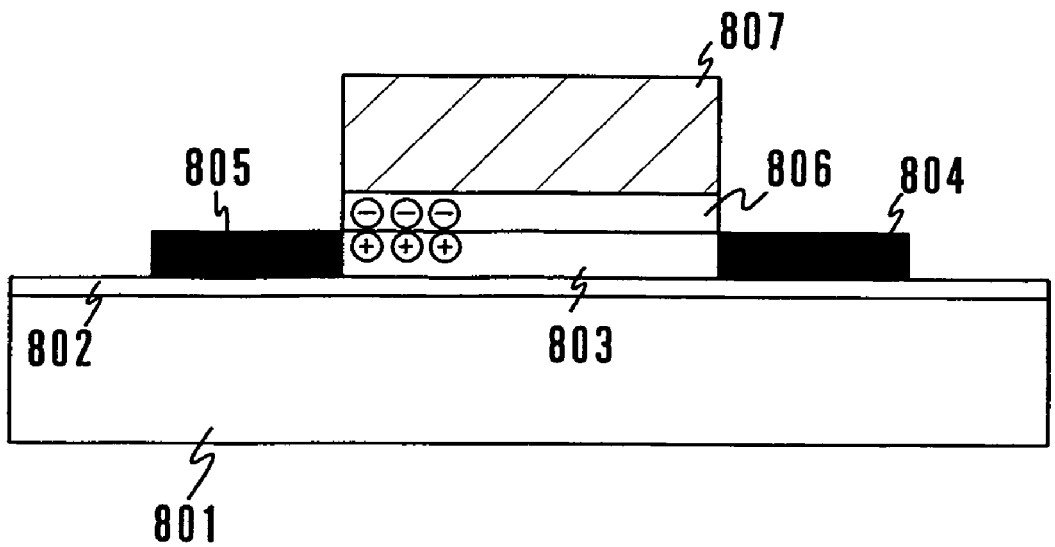
FIGS. 8A and 8B are diagrams showing a structure of an element with hot carrier degradation.

FIG. 8A is a cross, sectional view of a hot-carrier degraded TFT. A base film 802 is formed over an insulating substrate 801, and a TFT is formed thereover. The TFT is desirably an N-channel transistor. A voltage is applied between a gate electrode 807 and a source electrode 804 of the TFT and between a drain electrode 805 and the source electrode 804 of the TFT. In particular, when a high voltage is applied to the drain electrode 805, hot electrons are generated and injected into the drain side of a gate insulating film 806. Since hot carriers are negative charges, positive charges are pulled to the boundary of a channel region 803 and the gate insulating film 806. Positive charges at the drain side of the channel region 803 prevent a drain current from flowing easily.

Figure 8B:
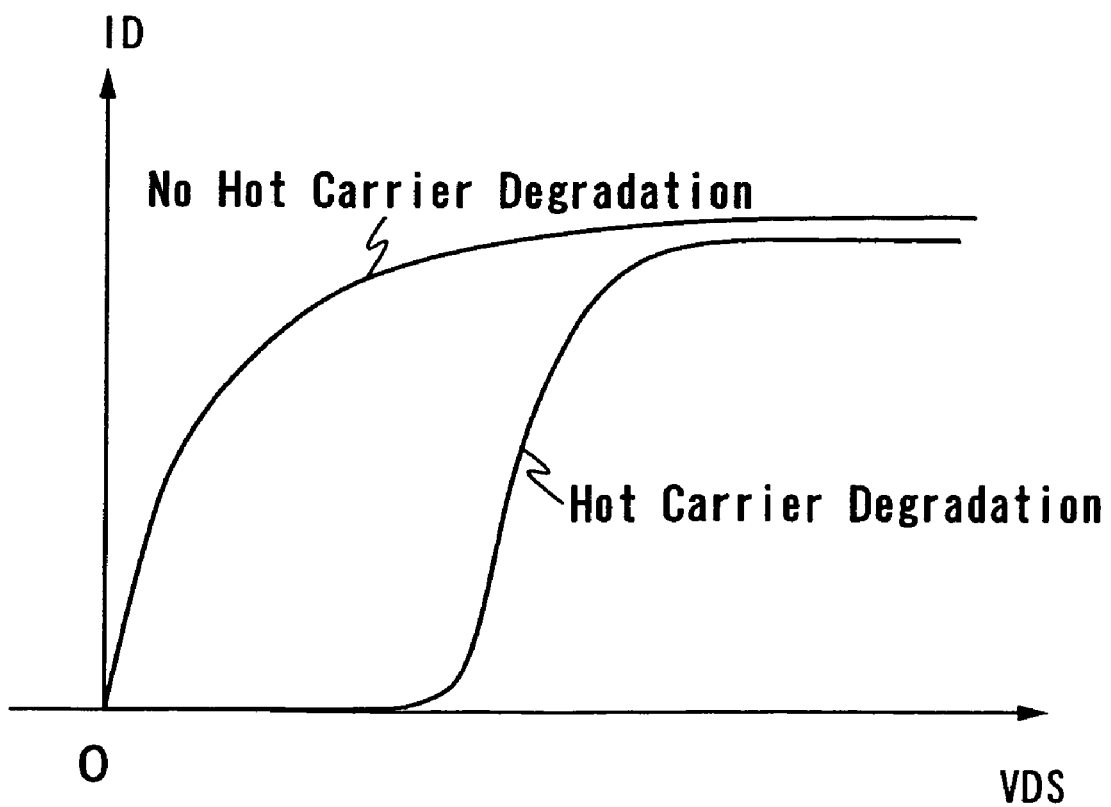

FIG. 8B shows the drain current of a TFT in the case of hot carrier degradation being caused and not being caused. As shown in FIG. 8B, the VDS of a hot-carrier degraded TFT varies even when the same current is supplied. Storage operation can be performed utilizing this phenomenon.

Embodiment 3

Figure 9:
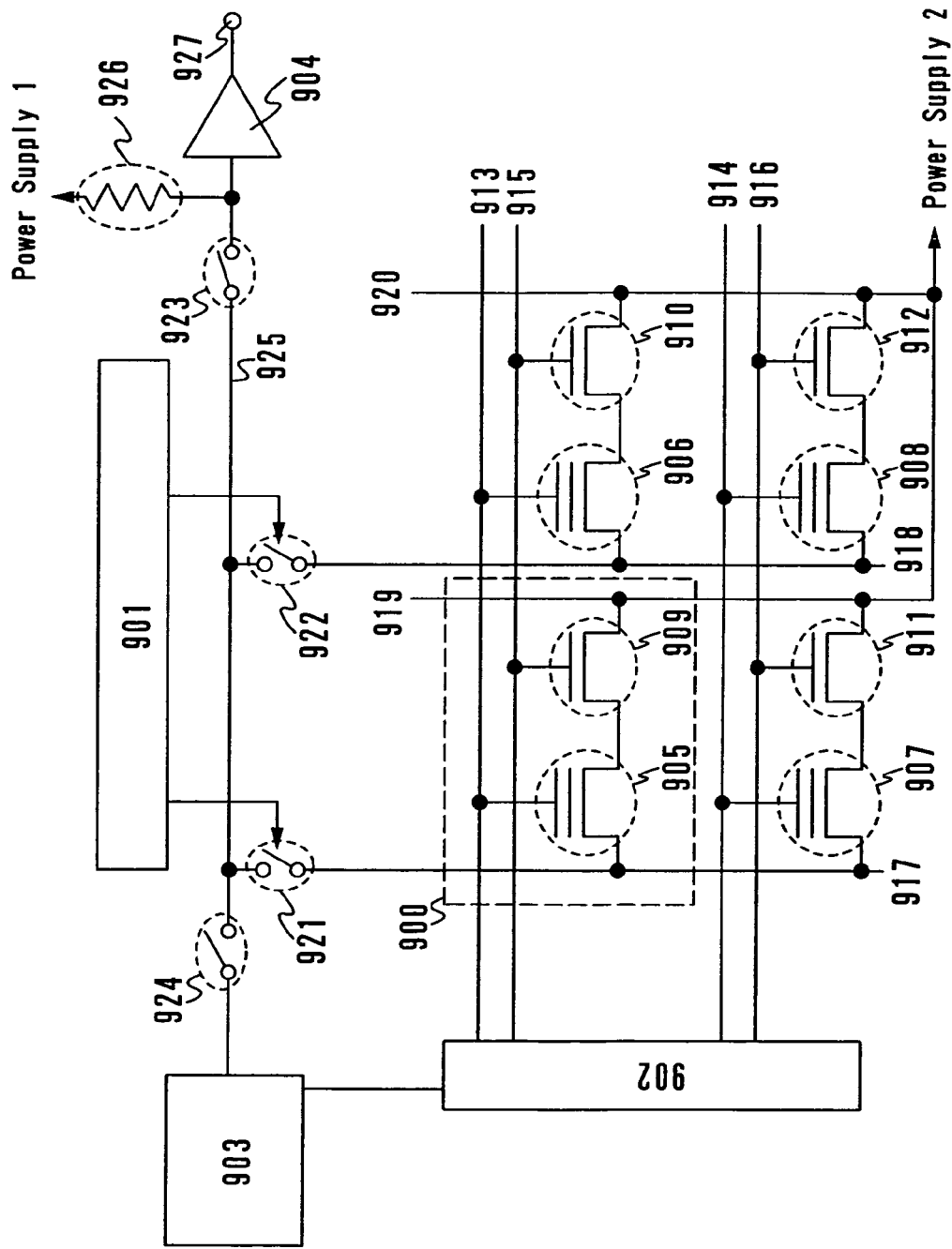
FIG. 9 is a diagram showing a configuration of an EEPROM.

Shown in FIG. 9 is an example of the case where charges are injected into a floating gate by using an external high voltage power supply 903 instead of generating a high voltage by rectifying, stabilizing and boosting an input signal from an antenna. In FIG. 9, charges are injected into a floating gate as shown in FIG. 5, though charges may be injected into a gate insulating film as shown in FIG. 7. Such an external high voltage power supply 903 is suitable for writing data in the test of chips. In general, an LSI test apparatus is equipped with a high voltage power supply, by which data can be written. When electrical test of chips is completed, the external high voltage power supply 903 is connected to a pad through a test probe to write data. The operation thereof is described below.

The operation of a nonvolatile memory circuit is described with reference to FIG. 9. The voltages are set similarly to those shown in Embodiment Mode except for the voltage of the external high voltage power supply 903. A memory cell 900 constituted by transistors 905 and 909 is described hereinafter as an example.

Described first is the case of writing data so that the memory cell 900 outputs a high signal. First, a row decoder 902 operates to activate a word line 915, thereby transistors 909 and 910 are turned on. Then, a column decoder 901 operates to turn on a switch 921, thereby a bit line 917 is connected to an output wiring 925. At this time, a switch 923 is turned off while a switch 924 is turned on. When the switch 924 is turned on, the output wiring 925 is connected to the external high voltage power supply 903, and applied with a high voltage which is set to −10 V herein. This voltage may be arbitrarily set depending on characteristics of a memory element.

Subsequently, the row decoder 902 operates to activate a word line 913. At this time, a voltage of +20 V is applied to the word line 913. This voltage may be arbitrarily set depending on the element capacity. Since the transistor 909 is on, voltages of +3 V, +20 V and −10 V are applied to the source terminal, the gate terminal and the drain terminal of the transistor 905 respectively. With the gate terminal being applied with a high voltage, charges are injected into the floating gate of the transistor 905, and the threshold value thereof is shifted to the positive side.

In the case of writing data so that the memory cell 900 outputs a low signal, the row decoder 902 operates to activate the word line 915, thereby the transistors 909 and 910 are turned on. Then, the column decoder 901 operates to turn on the switch 921, thereby the bit line 917 is connected to the output wiring 925. At this time, the switch 923 is turned off while the switch 924 is turned on. When the switch 924 is turned on, the output wiring 925 is connected to the external high voltage power supply 903, and applied with a high voltage which is set to −10 V herein. This voltage may be arbitrarily set depending on characteristics of a memory element. Subsequently, the row decoder 902 operates to activate the word line 913. At this time, a voltage of +3 V is applied to the word line 913. Since the transistor 909 is on, voltages of +3 V, +3 V and −10 V are applied to the source terminal, the gate terminal and the drain terminal of the transistor 905 respectively. With the gate terminal not being applied with a high voltage, charges are not injected into the floating gate of the transistor 905, and the initial state is maintained.

The external high voltage power supply is not used any longer when writing of data is completed, thus it is disconnected from the semiconductor device.

Described next is the case of reading data. In the case of reading data of the memory cell 900, the row decoder 902 operates to activate the word line 915, thereby the transistors 909 and 910 are turned on. Then, the column decoder 901 operates to turn on the switch 921, thereby the bit line 917 is connected to the output wiring 925. Further, the switch 923 is turned on, thereby the output wiring 925, a resistor 926 and an amplifier 904 are connected to each other. At this time, the switch 924 is turned off.

The row decoder 902 operates to activate the word line 913. At this time, the potential of the word line 913 is set to +3 V. Since the transistor 909 is on, the source potential, the gate potential and the drain potential of the transistor 905 are +3 V, +3 V, and +3 to 0 V respectively.

In the case where charges are injected into the floating gate of the transistor 905, the transistor 905 is on even when VGS=0 is satisfied. Thus, a current flows to the transistor 905 through the resistor 926, thereby the memory cell 900 outputs a high signal.

In the case where charges are not injected into the floating gate of the transistor 905, the transistor 905 is off when VGS=0 is satisfied. Thus, a current does not flow to the transistor 905 through the resistor 926, thereby the memory cell 900 outputs a low signal.

Embodiment 4

Figure 20:
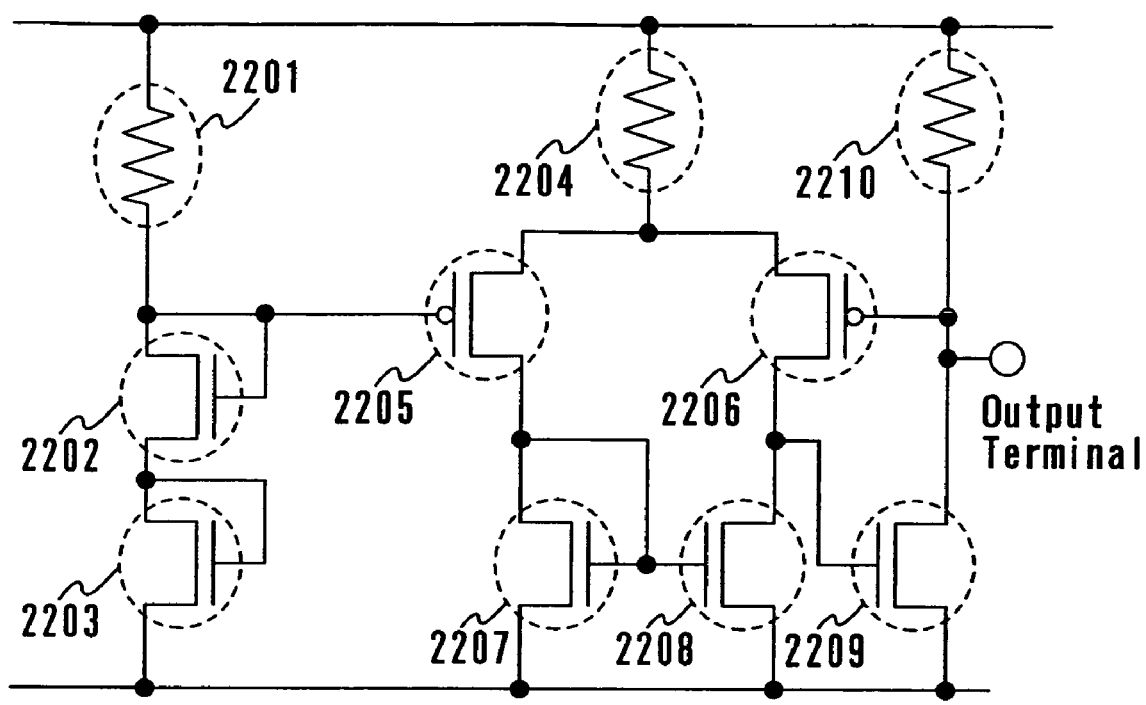
FIG. 20 is a diagram showing an example of a stabilizing power supply circuit of the invention.

An example of a stabilizing power supply circuit is described with reference to FIG. 20. The stabilizing power supply circuit is constituted by a reference voltage circuit and a buffer amplifier. The reference voltage circuit includes a resistor 2201, and diode connected transistors 2202 and 2203, and generates a reference voltage of the two VGS of the transistors. The buffer amplifier includes a differential circuit constituted by transistors 2205 and 2206, a current mirror circuit constituted by transistors 2207 and 2208, and a common source amplifier constituted by a current supply resistor 2204, a transistor 2209 and a resistor 2210.

When a large current is supplied from an output terminal, a small current flows to the transistor 2209. Meanwhile, when a small current is supplied from the output terminal, a large current flows to the transistor 2209. That is, a substantially constant current is supplied to the resistor 2210. The potential of the output terminal is substantially the same as that of the reference voltage circuit. Although the stabilizing power supply circuit is constituted by the reference voltage circuit and the buffer amplifier in this embodiment, the stabilizing power supply circuit used for the invention is not necessarily constituted in the aforementioned manner, and other structures may be adopted.

Embodiment 5

Figure 15:
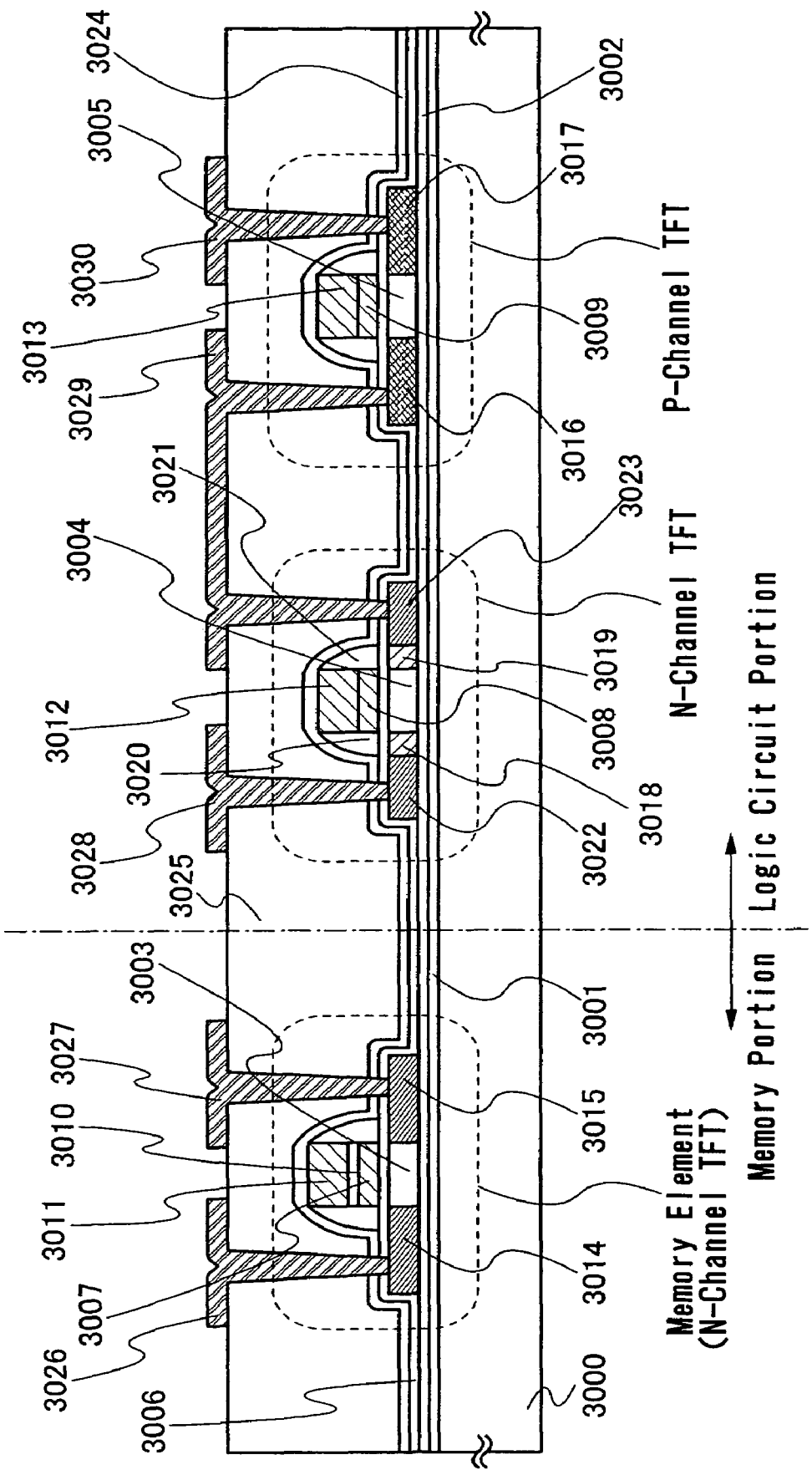
FIG. 15 is a cross sectional view of the invention.

Described with reference to FIG. 15 is a method of simultaneously manufacturing TFTs over an insulating substrate, which are used for the memory element and the logic circuit portion such as a decoder shown in Embodiment Mode. Note that in this embodiment, an N-channel memory element having a floating gate, an N-channel TFT and a P-channel TFT are taken as examples of the semiconductor elements included in the memory portion and the logic circuit portion, though the semiconductor elements are not limited to these in the invention. In addition, the manufacturing method over an insulating substrate shown here is just an example, and the invention is not limited to this.

First, base films 3001 and 3002 are formed over a substrate 3000 formed of glass or the like using an insulating film such as a silicon oxide film, a silicon nitride film and a silicon oxynitride film. For example, a silicon oxynitride film with a thickness of 10 to 200 nm is formed as the base film 3001, and a hydrogenated silicon oxynitride film with a thickness of 50 to 200 nm is formed thereon as the base film 3002.

Semiconductor layers 3003 to 3005 are formed of crystalline semiconductor films that are obtained by crystallizing an amorphous semiconductor film by a known laser crystallization method or thermal crystallization method. Each of the semiconductor layers 3003 to 3005 has a thickness of 25 to 80 nm. The material of the crystalline semiconductor films is not exclusively limited, though silicon or silicon germanium (SiGe) alloy is preferably used.

At this time, treatment for forming an overlap region at either the source region side or the drain region side of the semiconductor layer 3003 of a TFT used as a memory element may be performed in order to pull charges.

Subsequently, a gate insulating film 3006 is formed so as to cover the semiconductor layers 3003 to 3005. The gate insulating film 3006 is formed of an insulating film containing silicon by plasma CVD or sputtering so as to have a thickness of 10 to 80 nm. Particularly in an OTP nonvolatile memory where writing and charge storage due to hot electron injection are essential, the gate insulating film is preferably formed to have a thickness of 40 to 80 nm in order to suppress the tunnel current.

First conductive layers 3007 to 3009 are formed on the gate insulating film 3006, then removed by etching except in regions that are to be a floating gate electrode and gate electrodes of normal TFTs.

A second gate insulating film 3010 is formed by plasma CVD or sputtering. The second gate insulating film 3010 is formed of an insulating film containing silicon so as to have a thickness of 10 to 80 nm. The second gate insulating film 3010 is removed by etching except in a region where a memory element is formed.

Second conductive layers 3011 to 3013 are formed. Then, the lamination of the first conductive layer 3007, the second gate insulating film 3010 and the second conductive layer 3011 (memory element), the lamination of the first conductive layer 3008 and the second conductive layer 3012 (normal TFT), and the lamination of the first conductive layer 3009 and the second conductive layer 3013 (normal TFT) are etched at a time to form a floating gate electrode and a control gate electrode of the memory element and gate electrodes of the normal TFTs.

In this embodiment, the first conductive layers 3007 to 3009 are each formed of TaN with a thickness of 50 to 100 nm while the second conductive layers 3011 to 3013 are each formed of W with a thickness of 100 to 300 nm. However, the material of the conductive layers is not exclusively limited, and each may be formed of an element selected from Ta, W, Ti, Mo, Al, and Cu, or an alloy or a compound mainly containing the element.

An element that imparts N-type conductivity is doped to a TFT used for the memory element, thereby first impurity regions 3014 and 3015 are formed. Then, an element that imparts P-type conductivity is doped to a P-channel TFT used for the logic circuit portion, thereby second impurity regions 3016 and 3017 are formed. Subsequently, an element that imparts N-type conductivity is doped to an N-channel TFT used for the logic circuit portion, thereby third impurity regions 3018 and 3019 to be LDD regions are formed. Then, side walls 3020 and 3021 are formed and an element that imparts N-type conductivity is doped to the N-channel TFT used for the logic circuit portion, thereby fourth impurity regions 3022 and 3023 are formed. Such doping steps may be performed by ion doping or ion implantation. Through these steps, the impurity regions are formed in each island shape semiconductor layer.

The impurity elements added to each island shape semiconductor layer are activated. This step is performed by thermal annealing using an annealing furnace. Alternatively, laser annealing or rapid thermal annealing (RTA) may be adopted. Further, the island shape semiconductor layers are hydrogenated by applying heat treatment at a temperature of 300 to 450° C. for 1 to 12 hours in an atmosphere containing 3 to 100% of hydrogen. Plasma hydrogenation (using hydrogen excited by plasma) may be performed instead.

A first interlayer insulating film 3024 is formed of a silicon oxynitride film. The thickness of the first interlayer insulating film 3024 is set to about 10 to 80 nm similarly to that of the gate insulating film. Then, a second interlayer insulating film 3025 is formed of an organic insulating material such as acrylic. Instead of the organic insulating material, an inorganic material may also be used as the second interlayer insulating film 3025. As the inorganic material, inorganic $SiO_2$, $SiO_2$ obtained by plasma CVD (PCVD-$SiO_2$), SOG (Spin On Glass; silicon oxide coated film), or the like is used. After forming the two interlayer insulating films, etching step is performed for forming contact holes.

In the memory portion, electrodes 3026 and 3027 connected to the source region and the drain region of the island shape semiconductor layer are formed. Similarly in the logic circuit portion, electrodes 3028 to 3030 are formed.

In such a manner, the memory portion that includes the N-channel memory element with a floating gate and the logic circuit portion that includes the N-channel TFT with an LDD structure and the P-channel TFT with a single drain structure can be formed over the same substrate (see FIG. 15).

In this embodiment, a method of manufacturing a memory portion and a logic circuit portion and transferring them to a flexible substrate is described with reference to FIGS. 16A and 16B and FIGS. 17A and 17B. Note that in this embodiment, an N-channel memory element having a floating gate, an N-channel TFT and a P-channel TFT are taken as examples of semiconductor elements included in the memory portion and the logic circuit portion, though the semiconductor elements are not limited to these in the invention. In addition, the manufacturing method over an insulating substrate shown here is just an example, and the invention is not limited to this.

A peeling layer 4000 is formed over the substrate 3000. The peeling layer 4000 may be formed by sputtering, plasma CVD or the like using a film mainly containing silicon such as amorphous silicon, polycrystalline silicon, single crystalline silicon, and microcrystalline silicon (including semi-amorphous silicon). In this embodiment, an amorphous silicon film with a thickness of about 500 nm is formed by sputtering to be used as the peeling layer 4000. Then, a memory portion and a logic circuit portion as shown in FIG. 15 are formed by the manufacturing steps described in the aforementioned embodiment.

Subsequently, a third interlayer insulating film 4001 is formed over the second interlayer insulating film 3025, and pads 4002 to 4005 are formed of a conductive material having one or more metals selected from Ag, Au, Cu, Pd, Cr, Mo, Ti, Ta, W, and Al, or a metal compound containing them.

A protective layer 4006 is formed over the third interlayer insulating film 4001 so as to cover the pads 4002 to 4005. The protective layer 4006 is formed of a material that can protect the pads 4002 to 4005 when removing the peeling layer 4000 by etching. For example, the protective layer 4006 may be formed by applying on an entire surface an epoxy-based resin, an acrylate-based resin, or a silicon-based resin that is soluble in water or alcohols (FIG. 16A).

Figures 16A, 16B:
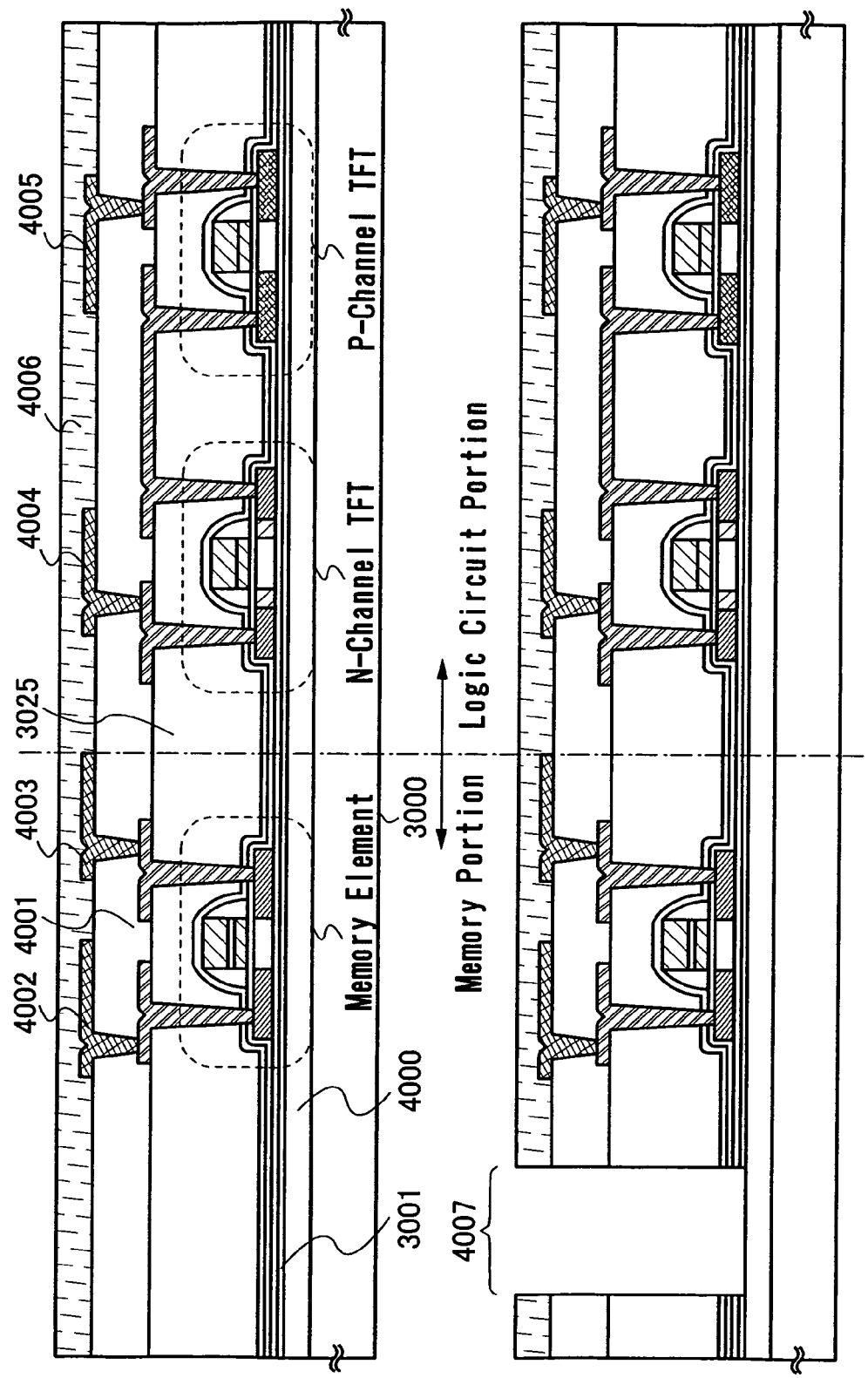
FIGS. 16A and 16B are cross sectional views showing manufacturing steps of the invention.

A groove 4007 for separating the peeling layer 4000 is formed (FIG. 16B). The groove 4007 is formed so as to expose the peeling layer 4000 by etching, dicing, scribing or the like.

Figures 17A, 17B:
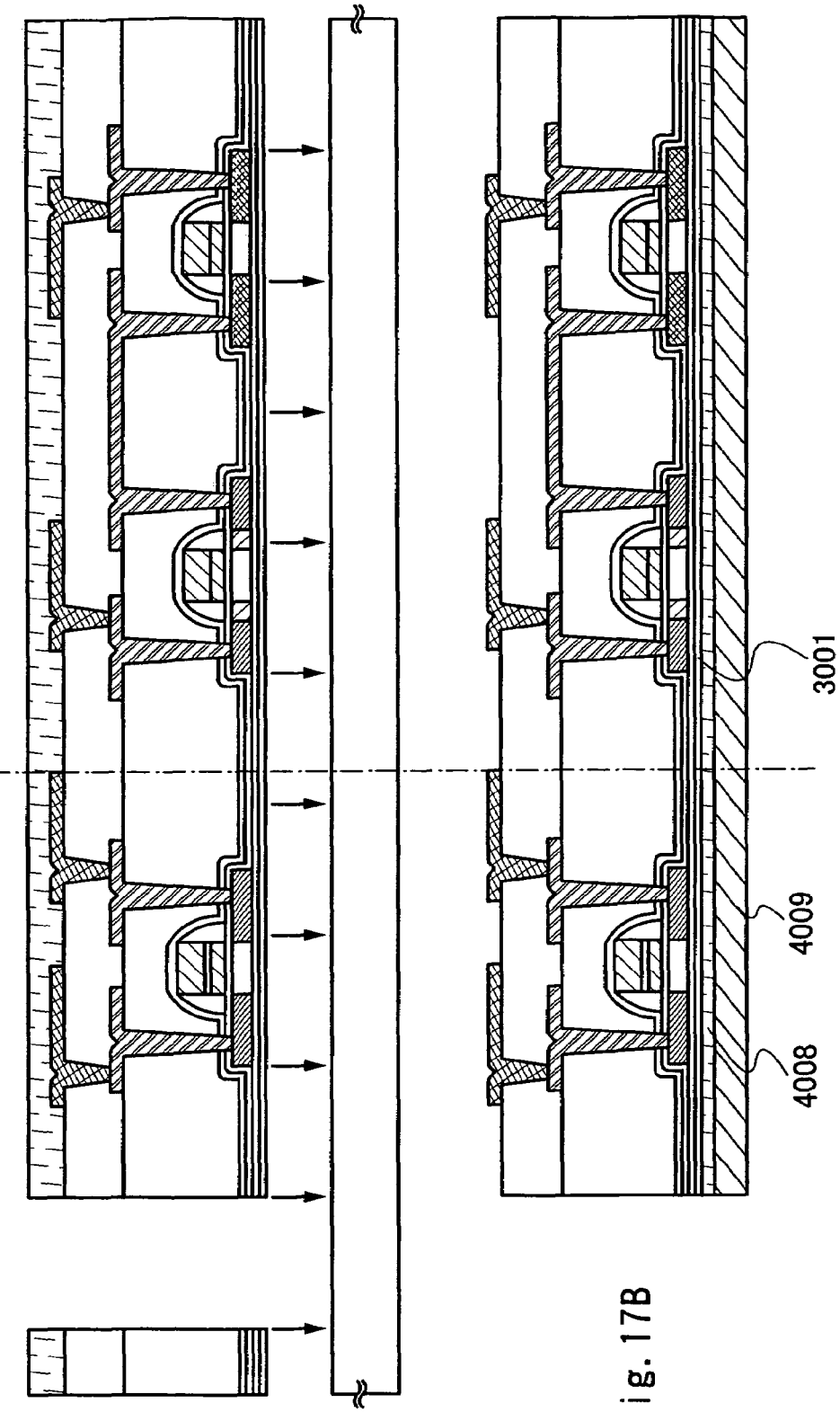
FIGS. 17A and 17B are cross sectional views showing manufacturing steps of the invention.

The peeling layer 4000 is removed by etching (FIG. 17A). In this embodiment, fluorine halide is used as an etching gas and introduced into the groove 4007. For example, etching may be performed using $ClF_3$ (chlorine trifluoride) at a temperature of 350° C., a flow rate of 300 sccm, and a pressure of 6 Torr for three hours. Alternatively, $ClF_3$ gas mixed with nitrogen may be used as well. The peeling layer 4000 can be selectively etched by using fluorine halide such as $ClF_3$, and thus the substrate 3000 can be peeled off. Note that fluorine halide may be either a gas or a liquid.

The peeled memory portion and logic circuit portion are attached to a support base 4009 with an adhesive 4008 (FIG. 17B). The adhesive 4008 is formed of a material capable of attaching the support base 4009 to the base film 3001. The adhesive 4008 may be formed of, for example, various curable adhesives such as a reactive curable adhesive, a heat curable adhesive, and a photo-curable adhesive such as an ultraviolet curable adhesive, and an anaerobic adhesive.

For the support base 4009, a flexible organic material such as paper and plastic can be used. Alternatively, the support base 4009 may be formed of a flexible inorganic material. It is desirable that the support base 4009 have a high thermal conductivity of about 2 to 30 W/mK in order to disperse the heat generated in an integrated circuit.

A method of peeling off the integrated circuit in the memory portion and the logic circuit portion from the substrate 3000 is not limited to the one using the etching of a silicon film as shown in this embodiment, and other various methods may be adopted. For example, there are a method in which a metal oxide film is formed between a heat resistant substrate and an integrated circuit, and the metal oxide film is weakened by crystallization to peel off the integrated circuit; a method in which a peeling layer is destroyed by laser irradiation to peel off an integrated circuit from a substrate; and a method in which a substrate over which an integrated circuit is formed is removed mechanically or by etching using a solution or a gas to peel off the integrated circuit from the substrate.

In the case where a surface of an object is curved and thereby the support base of an ID chip attached to the curved surface is curved so as to have a curved surface along a generating line such as a conical surface and a columnar surface, it is preferable to make the direction of the generating line be the same as the moving direction of carriers of the TFT. According to the aforementioned structure, it can be suppressed that the characteristics of the TFT are affected when the support base is curved. Moreover, by setting the ratio of an area occupied by an island shape semiconductor film in the thin film integrated circuit to be 1 to 30%, it can further be suppressed that the characteristics of the TFT are affected when the support base is curved. This embodiment can be implemented in combination with the aforementioned embodiment mode and other embodiments.

Embodiment 6

Figure 21A:
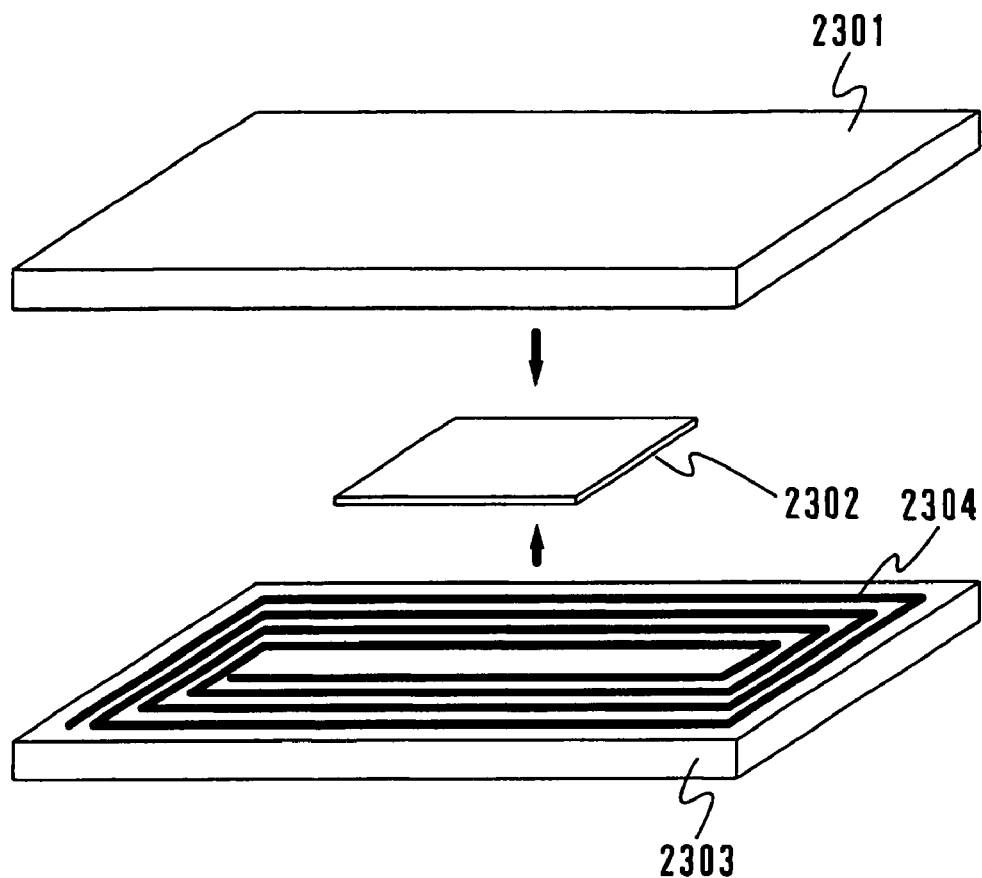
FIGS. 21A and 21B are diagrams showing a combination of a protective layer and a semiconductor device of the invention.
Figure 21B:
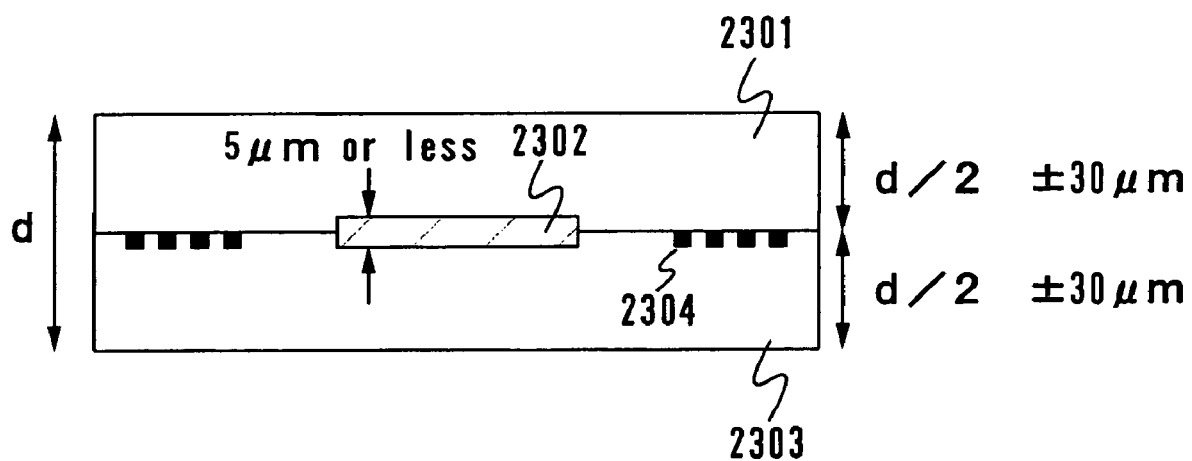

Described with reference to FIGS. 21A and 21B is the case of forming a flexible ID tag by a peeling process. The ID tag is constituted by flexible protective layers 2301 and 2303, and an ID chip 2302 formed by a peeling process. In this embodiment, an antenna 2304 is not formed on the ID chip 2302 but on the flexible protective layer 2303, and electrically connected to the ID chip 2302. Although the antenna 2304 is formed only on the flexible protective layer 2303, it may also be formed on the flexible protective layer 2301. The antenna 2304 is desirably formed of silver, copper, or metal coated with them. The antenna 2304 is connected to the ID chip 2302 by UV treatment using an anisotropic conductive film, though the connecting method is not limited to this.

FIG. 21B is a cross sectional view of FIG. 21A. The ID chip 2302 has a thickness of 5 µm or less, and preferably a thickness of 0.1 to 3 µm. The thickness of the flexible protective layers 2301 and 2303 is desirably set so that the total thickness d thereof is (d/2)±30 µm, and more preferably (d/2)±10 µm. It is desirable that the flexible protective layers 2301 and 2303 each have a thickness of 10 to 200 µm. The area of the ID chip 2302 is 5 mm square or less, and preferably 0.3 to 4 mm square.

The flexible protective layers 2301 and 2303, which are formed of an organic resin material, have a structure resistant to bending. The ID chip 2302 itself formed by a peeling process is resistant to bending as compared with a single crystalline semiconductor, therefore, it can be firmly attached to the flexible protective layers 2301 and 2303. Such an ID chip sandwiched between the flexible protective layers 2301 and 2303 may further be disposed on a surface of or inside an object, or mounted inside a piece of paper.

Embodiment 7

Figure 19:
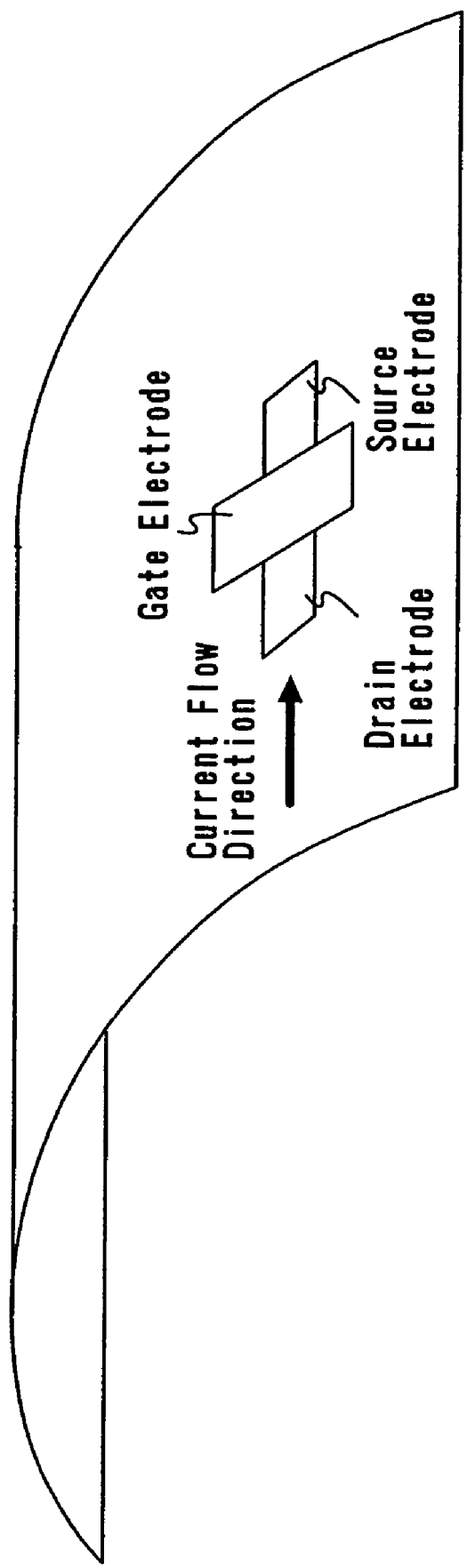
FIG. 19 is a diagram showing an arrangement of a TFT of the invention.

Described with reference to FIG. 19 is the case where an ID chip is attached to a curved surface, that is a TFT is disposed perpendicular to the arc drawn by the ID chip. A TFT included in the ID chip in FIG. 19 has a linear current direction, namely a drain electrode, a gate electrode and a source electrode of the TFT are disposed perpendicular to the arc drawn by the ID chip, thereby less stress is applied thereto. Such an arrangement allows variations in characteristics of TFTs to be suppressed. The crystal orientation of the TFT is the same as the current direction. By using CWLC or the like, the S value can be set to 0.35 V/dec or less (preferably 0.09 to 0.25 V/dec), and the mobility to 100 cm$^2$/Vs or more.

A 19-stage ring oscillator constituted by such a TFT has an oscillation frequency of 1 MHz or more, and preferably 100 MHz or more at a power supply voltage of 3 to 5 V. The delay time for each stage of an inverter is 26 ns, and preferably 0.26 ns or less at a power supply voltage of 2 to 5 V.

In order to prevent an active element such as a TFT from being damaged due to stress, the ratio of an area occupied by an active region (silicon island portion) of the active element such as a TFT is desirably set to 5 to 50%.

A region in which an active element such as a TFT is not provided mainly includes a base film insulating material, an interlayer insulating material and a wiring material. The area other than an active region of a TFT is desirably set to 60% or more.

The thickness of an active region of a TFT is 20 to 200 nm, typically 40 to 170 nm, and preferably 45 to 55 nm or 145 to 155 nm.

Embodiment 8

In this embodiment, an example in which an antenna is attached externally to a circuit using the invention is described with reference to FIGS. 10A to 10E and FIGS. 11A to 11C.

Figure 10A:
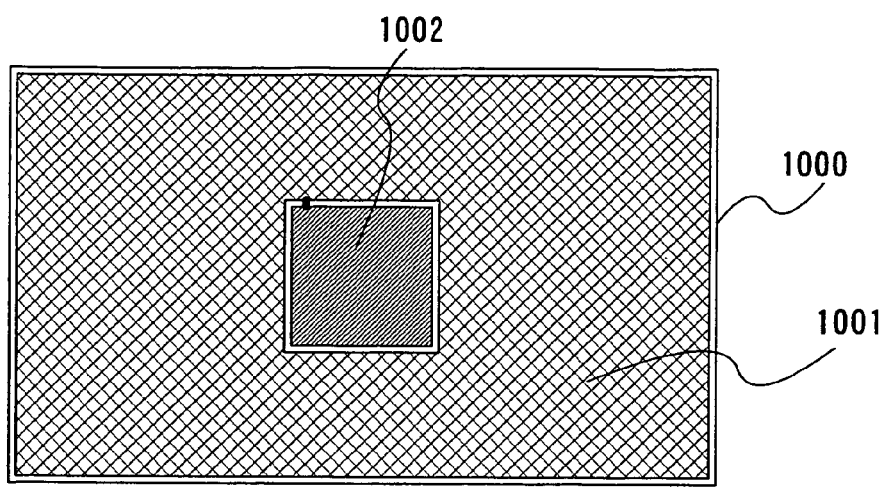
FIGS. 10A to 10E are diagrams showing embodiments of an antenna of the invention.

FIG. 10A shows a circuit surrounded by an antenna. An antenna 1001 is formed over a substrate 1000, and a circuit 1002 using the invention is connected thereto. In FIG. 10A, the periphery of the circuit 1002 is covered with the antenna 1001, though an entire surface of the substrate may be covered with the antenna 1001 and the circuit 1002 including electrodes may be attached thereon.

Figure 10B:
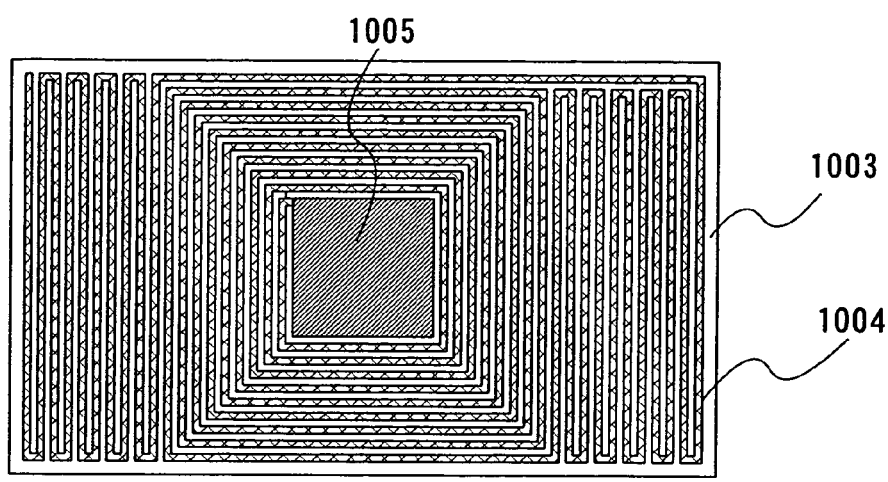

In FIG. 10B, a thin antenna is disposed so as to circle around a circuit. An antenna 1004 is formed over a substrate 1003, and a circuit 1005 using the invention is connected thereto. Note that the antenna wiring is just an example, and the invention is not limited to this.

Figure 10C:
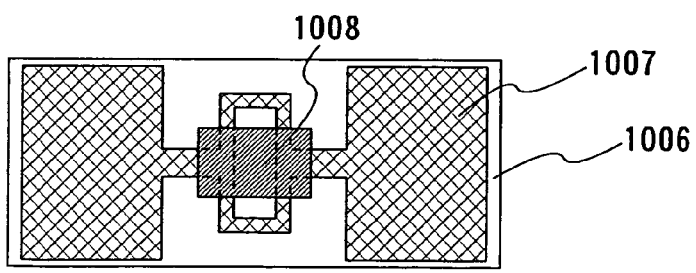

FIG. 10C shows an RF antenna. An antenna 1007 is formed over a substrate 1006, and a circuit 1008 using the invention is connected thereto.

Figure 10D:
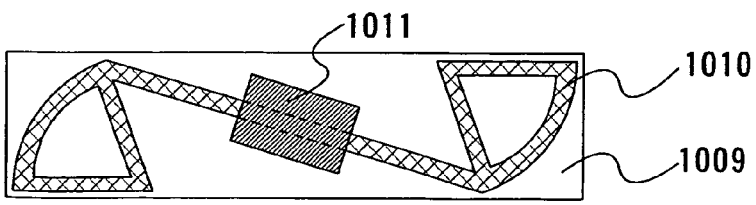

FIG. 10D shows a 180° omnidirectional antenna (capable of receiving radio waves from any direction). An antenna 1010 is formed over a substrate 1009, and a circuit 1011 using the invention is connected thereto.

Figure 10E:
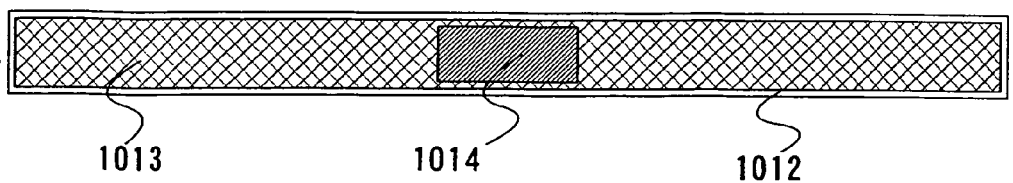

FIG. 10E shows an antenna formed to a stick shape. An antenna 1013 is formed over a substrate 1012, and a circuit 1014 using the invention is connected to thereto.

The circuit using the invention can be connected to such an antenna by a known method. For example, the circuit and the antenna may be connected by wire bonding or bump bonding. Alternatively, a surface of the circuit formed as a chip may be used as an electrode to be attached to the antenna. In the latter method, the circuit can be attached to the antenna by using an ACF (Anisotropic Conductive Film).

An appropriate length of the antenna is different depending on the frequency used for reception. It is generally preferable that the antenna be as long as an integer fraction of the frequency. For example, in the case where the frequency is 2.45 GHz, the antenna is preferably about 60 mm (½ wavelength) or about 30 mm (¼ wavelength).

Figures 11A, 11B, 11C:
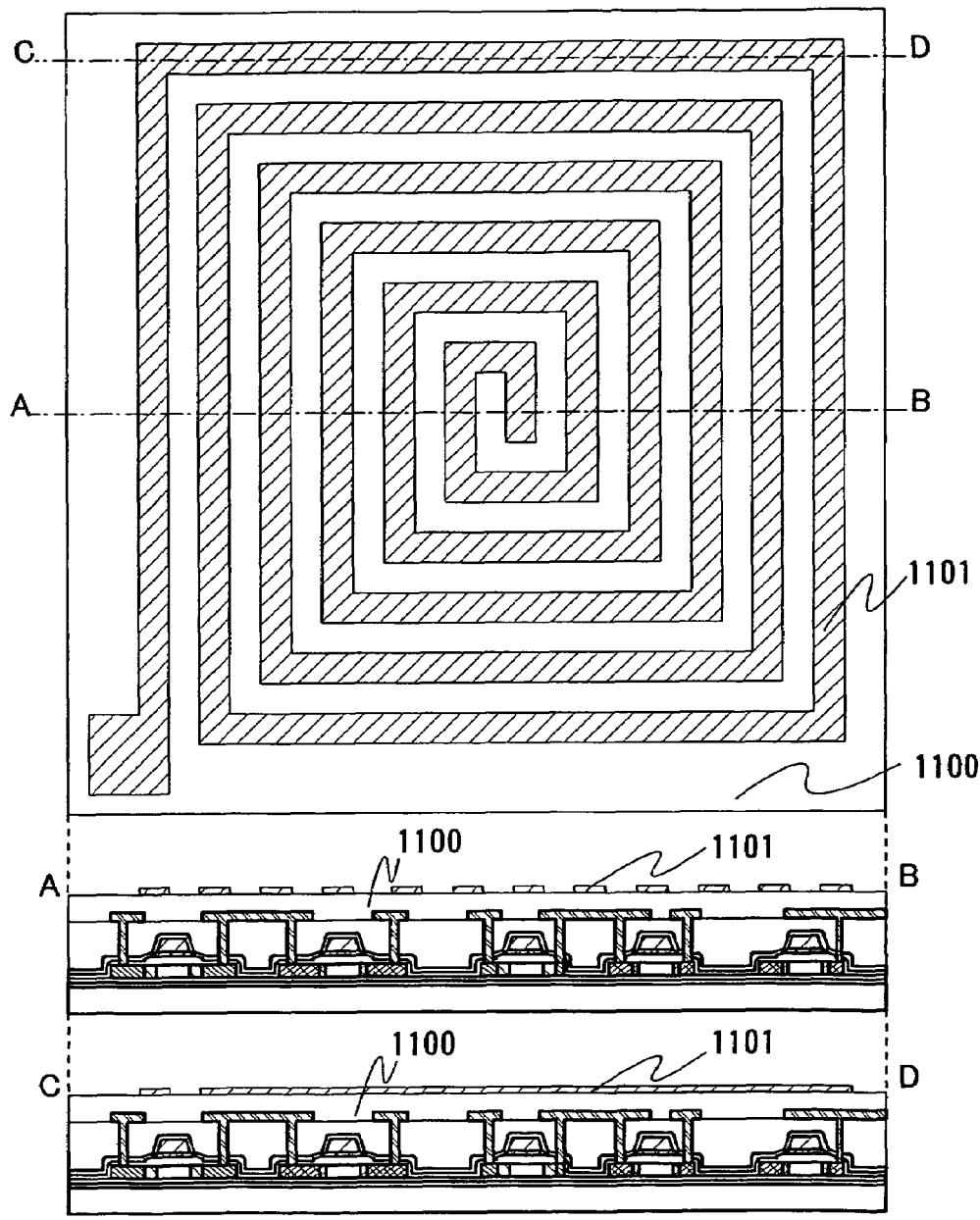
FIGS. 11A to 11C are diagrams showing embodiments of an antenna of the invention.

Moreover, it is possible to attach another substrate to the circuit of the invention and form an antenna thereover. FIGS. 11A to 11C show a top plan view and cross-sectional views of a circuit over which a substrate is attached and a spiral antenna is provided thereover.

Note that the antenna shown in this embodiment is just an example and the shape of the antenna is not limited to this. The invention can be implemented with any form of antenna. This embodiment can be implemented in combination with Embodiment Mode and Embodiments 1 to 7.

Embodiment 9

In this embodiment, a method for manufacturing a thin film integrated circuit device including a TFT is described in detail with reference to FIGS. 22A to 22E, FIGS. 23F to 23I and FIGS. 24A and 24B. For simplicity, the manufacturing method is described herein by showing a cross sectional structure of a CPU and a memory portion using an N-channel TFT and a P-channel TFT.

Figure 22A:
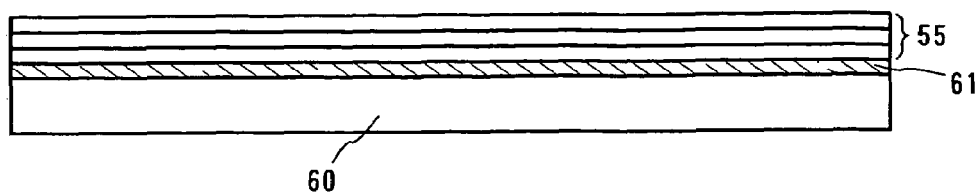
FIGS. 22A to 22E are cross sectional views showing manufacturing steps of the invention.

First, a peeling layer 61 is formed over a substrate 60 (FIG. 22A). The peeling layer 61 here is formed of an a-Si film (an amorphous silicon film) with a thickness of 50 nm (500 Å) over a glass substrate (e.g., a 1737 substrate, product of Corning Incorporated) by low pressure CVD. As for the substrate 60, a quartz substrate, a substrate made of an insulating material such as alumina, a silicon wafer substrate, a plastic substrate having enough heat resistance to the treatment temperature in the subsequent step, and the like may be employed as well as the glass substrate.

The peeling layer 61 is preferably formed of a film mainly containing silicon such as polycrystalline silicon, single crystalline silicon, SAS (semi-amorphous silicon that is also referred to as microcrystalline silicon) as well as amorphous silicon, though the invention is not limited to these. The peeling layer 61 may be formed by plasma CVD or sputtering as well as low pressure CVD. In addition, a film doped with an impurity such as phosphorous may be employed as well. The thickness of the peeling layer 61 is desirably 50 to 60 nm, though it may be 30 to 50 nm in the case of employing a SAS.

Next, a protective layer 55 (also referred to as a base film or a base insulating film) is formed over the peeling layer 61 (FIG. 22A). Here, the protective layer 55 is structured by three layers of a SiON film with a thickness of 100 nm, a SiNO film with a thickness of 50 nm, and a SiON film with a thickness of 100 nm, though the material, the thickness, and the number of layers are not limited to this. For example, instead of the SiON film on the bottom layer, a heat resistant resin such as siloxane may be formed to have a thickness of 0.5 to 3 μm by spin coating, slit coating, droplet discharge, or the like. Alternatively, a silicon nitride film (SiN, $Si_3N_4$ or the like) may be employed. The respective thicknesses of the layers are preferably 0.05 to 3 μm and can be selected within this range as required.

Here, a silicon oxide film can be formed by thermal CVD, plasma CVD, atmospheric pressure CVD, bias ECRCVD, or the like using a mixed gas such as $SiH_4/O_2$ and TEOS (tetraethoxy silane)/$O_2$. A silicon nitride film can be typically formed by plasma CVD using a mixed gas of $SiH_4/NH_3$. The SiON film or the SiNO film can be typically formed by plasma CVD using a mixed gas of $SiH_4/N_2O$.

Note that in the case where a material mainly containing silicon such as a-Si is employed for the peeling layer 61 and an island shape semiconductor film 57, the protective layer 55 that is in contact with them may be formed of $SiO_xN_y$ in view of the adhesiveness.

Subsequently, thin film transistors (TFTs) for constituting a CPU and a memory of a thin film integrated circuit device are formed over the protective layer 55. Note that other thin film active elements such as organic TFTs and thin film diodes may be formed as well as the TFTs.

Figure 22B:
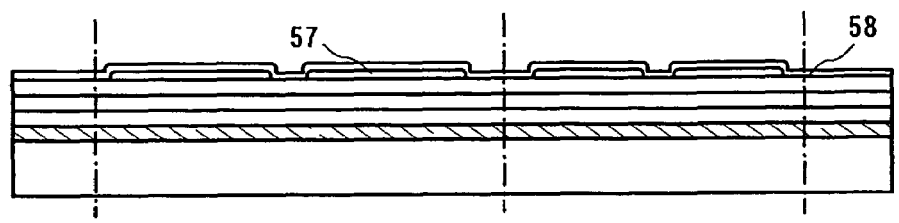

For forming a TFT, first, the island shape semiconductor film 57 is formed over the protective layer 55 (FIG. 22B). The island shape semiconductor film 57 is formed of an amorphous semiconductor, a crystalline semiconductor, or a semi-amorphous semiconductor, which mainly contains silicon, silicon germanium (SiGe), or the like.

Here, an amorphous silicon film with a thickness of 70 nm is formed and a surface thereof is treated with a solution containing nickel. Thermal crystallization is performed at a temperature of 500 to 750° C. so that a crystalline silicon semiconductor film is obtained. Then, the crystallinity thereof is improved by laser crystallization. Note that the film may be formed by plasma CVD, sputtering, LPCVD, or the like. As a crystallizing method thereof, laser crystallization, thermal crystallization, or thermal crystallization using a catalyst (Fe, Ru, Rh, Pd, Os, Ir, Pt, Cu, Au, or the like) may be adopted, or such methods may be performed alternately a plurality of times.

In addition, the semiconductor film having an amorphous structure may be crystallized by a continuous wave laser. In order to obtain a crystal with a large grain size in crystallizing, a solid state laser capable of continuous wave may be used and it is preferable to apply second to fourth harmonics of a fundamental wave (the crystallization in this case is referred to as CWLC). Typically, a second harmonic (532 nm) or a third harmonic (355 nm) of a Nd:$YVO_4$ laser (a fundamental wave: 1064 nm) is applied. When a continuous wave laser is used, laser light emitted from a continuous wave $YVO_4$ laser of which output is 10 W is converted into a harmonic by a non-linear optical element. In addition, there is a method for emitting a harmonic by putting an $YVO_4$ crystal or a $GdVO_4$ crystal and a non-linear optical element in a resonator. Then, the laser light is preferably formed to a rectangular shape or an ellipse shape at an irradiated surface with an optical system to irradiate a subject. In that case, the energy density of about 0.01 to 100 $MW/cm^2$ (preferably 0.1 to 10 $MW/cm^2$) is required. Then, the semiconductor film is preferably irradiated with laser light while being moved relatively to the laser light at a speed of about 10 to 2000 cm/sec.

In the case where a pulsed laser is used, a pulsed laser having a frequency band from several tens to several hundreds Hz is generally used, though a pulsed laser having an extremely higher oscillation frequency of 10 MHz or more may be used as well (the crystallization in this case is referred to as MHzLC). It is said that it takes several tens to several hundreds nsec to solidify a semiconductor film completely after the semiconductor film is irradiated with the pulsed laser light. When the pulsed laser light has an oscillation frequency of 10 MHz or more, it is possible to irradiate the next pulsed laser light before the semiconductor film is solidified after it is melted by the previous laser light. Therefore, unlike the case of the conventional pulsed laser, the interface between the solid phase and the liquid phase can be moved continuously in the semiconductor film, and thus the semiconductor film having a crystal grain grown continuously along the scanning direction can be formed. Specifically, it is possible to form an aggregation of crystal grains each of which has a width of 10 to 30 μm in the scanning direction and a width of about 1 to 5 μm in the direction perpendicular to the scanning direction. By forming such single crystal grains extended long in the scanning direction, a semiconductor film having few grain boundaries at least in the channel direction of the TFT can be formed.

Note that when the protective layer 55 is partially formed of siloxane that is a heat resistant organic resin, heat leak from the semiconductor film can be prevented in the aforementioned crystallization, thereby the crystallization can be performed efficiently.

The crystalline silicon semiconductor film is obtained through the aforementioned steps. The crystals thereof are preferably aligned in the same direction as the source, channel and drain direction. The thickness of the crystalline layer thereof is preferably 20 to 200 nm (typically 40 to 170 nm, and more preferably 50 to 150 nm). Subsequently, an amorphous silicon film for gettering of a metal catalyst is formed over the semiconductor film with an oxide film interposed therebetween, and heat treatment is performed at a temperature of 500 to 750° C. for gettering. Furthermore, in order to control a threshold value as a TFT element, boron ions are injected into the crystalline silicon semiconductor film at the dosage of $10^{13}/cm^2$. Then, etching is performed with a resist used as a mask to form the island shape semiconductor film 57.

Note that the crystalline semiconductor film may be obtained as well by forming a polycrystalline semiconductor film directly by LPCVD (Low Pressure CVD) using a source gas of disilane ($Si_2H_6$) and germanium fluoride ($GeF_4$). The flow rate of the gas is such that $Si_2H_6/GeF_4=20/0.9$, the temperature for forming the film is 400 to 500° C., and He or Ar is used as a carrier gas, though the invention is not limited to these.

Note that the TFT, particularly a channel region thereof is preferably added with hydrogen or halogen of $1\times10^{19}$ to $1\times10^{22}$ cm$^{-3}$, and more preferably $1\times10^{19}$ to $5\times10^{20}$ cm$^{-3}$. In the case of an SAS, it is preferably added with hydrogen or halogen of $1\times10^{19}$ to $2\times10^{21}$ cm$^{-3}$. In either case, it is desirable that the amount of hydrogen or halogen be larger than that contained in single crystals used for an IC chip. Accordingly, a local crack that may be generated at the TFT portion can be terminated by hydrogen or halogen.

Then, a gate insulating film 58 is formed over the island shape semiconductor film 57 (FIG. 22B). The gate insulating film 58 is preferably formed of a single layer or laminated layers of a film containing silicon nitride, silicon oxide, silicon nitride oxide, or silicon oxynitride by a thin film forming method such as plasma CVD and sputtering. In the case of the laminated layer, for example, a three-layer structure may be adopted, in which a silicon oxide film, a silicon nitride film and a silicon oxide film are laminated in this order over the substrate.

Figure 22C:
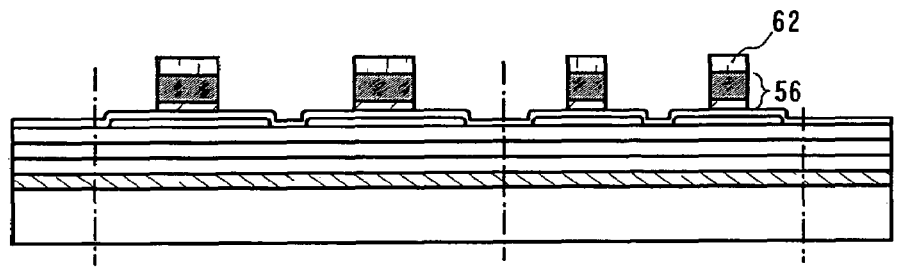
Figure 22D:
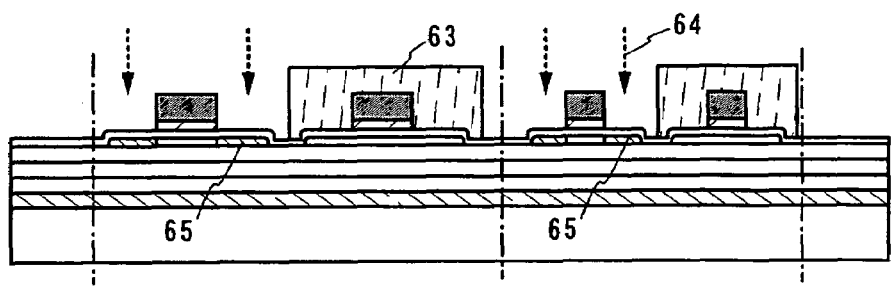
Figure 22E:
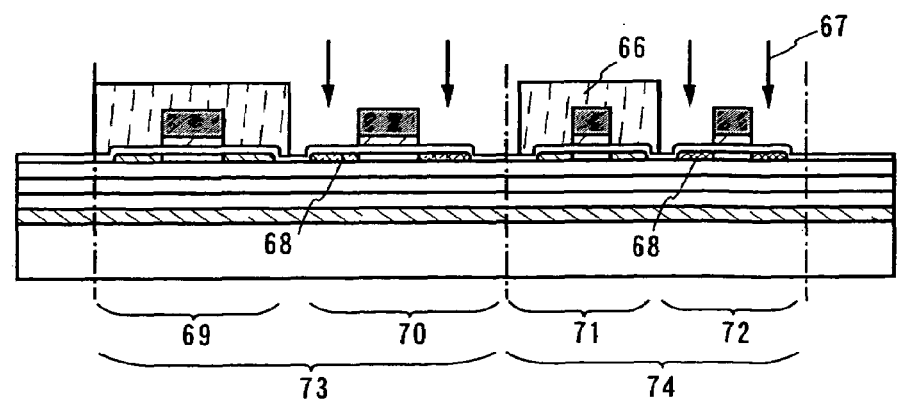

Subsequently, a gate electrode 56 is formed (FIG. 22C). In this embodiment, Si and W (tungsten) are laminated by sputtering, and etched with a resist 62 used as a mask to form the gate electrode 56. Needless to say, the material, the structure, and the forming method of the gate electrode 56 are not limited to these and can be selected appropriately. For example, a laminated structure of Si and NiSi (Nickel Silicide) doped with an N-type impurity, or a laminated structure of TaN (tantalum nitride) and W (tungsten) may be employed. Alternatively, the gate electrode 56 may be formed of a single layer employing any conductive material.

A mask of $SiO_x$ or the like may be used instead of the resist mask. In this case, a patterning step of the mask such as $SiO_x$ and SiON (referred to as a hard mask) is additionally required, while the mask film is less decreased in etching as compared with the case of using the resist mask, thereby a gate electrode layer can be formed with a desired width. Alternatively, the gate electrode 56 may be selectively formed by droplet discharge without using the resist 62.

As for the conductive material, various kinds of materials can be selected depending on the function of the conductive film. In addition, when the gate electrode and the antenna are simultaneously formed, the material may be selected in consideration of their functions.

As an etching gas for etching the gate electrode, a mixed gas of $CF_4$, $Cl_2$, and $O_2$, or a $Cl_2$ gas is employed here, though the invention is not limited to this.

Subsequently, a resist 63 is formed so as to cover portions to be P-channel TFTs 70 and 72. An N-type impurity element 64 (typically, P (phosphorous) or As (arsenic)) is doped to the island shape semiconductor films of N-channel TFTs 69 and 71 at a low concentration with the gate electrode used as a mask (a first doping step, FIG. 22D). The first doping step is performed under such conditions as a dosage of $1\times10^{13}$ to $6\times10^{13}/cm^2$ and an accelerated voltage of 50 to 70 keV, though the invention is not limited to these. In the first doping step, through doping is performed through the gate insulating film 58 to form a couple of low concentration impurity regions 65. Note that the first doping step may be applied to the entire surface without covering P-channel TFT regions.

After the resist 63 is removed by ashing or the like, another resist 66 is formed so as to cover N-channel TFT regions. A P-type impurity element 67 (typically, B (boron)) is doped to the island shape semiconductor films of the P-channel TFTs 70 and 72 at a high concentration with the gate electrode used as a mask (a second doping step, FIG. 22E). The second doping step is performed under such conditions as a dosage of $1\times10^{16}$ to $3\times10^{16}/cm^2$ and an accelerated voltage of 20 to 40 keV, though the invention is not limited to these. In the second doping step, through doping is performed through the gate insulating film 58 to form a couple of P-type high concentration impurity regions 68.

Figure 23A:
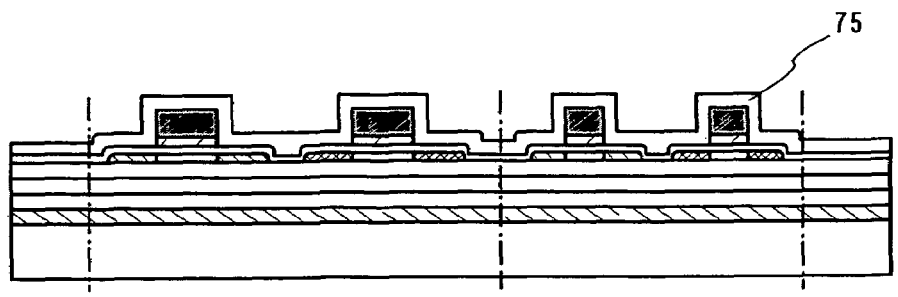
FIGS. 23A to 23D are cross sectional views showing manufacturing steps of the invention.
Figure 23B:
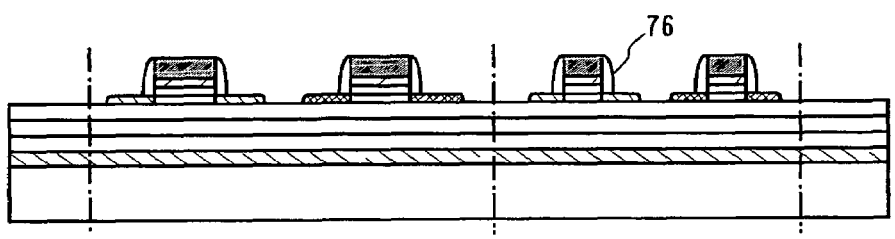

After the resist 66 is removed by ashing or the like, an insulating film 75 is formed over the entire surface of the substrate (FIG. 23A). In this embodiment, a $SiO_2$ film is formed with a thickness of 100 nm by plasma CVD. Then, the insulating film 75 and the gate insulating film 58 are removed by etch back to form a sidewall 76 in a self-aligned manner (FIG. 23B). As an etching gas, a mixed gas of $CHF_3$ and He is employed. Note that the forming step of the sidewall is not limited to this.

Note that in the case where an insulating film is formed over the opposite surface of the substrate as well when forming the insulating film 75, the insulating film over the opposite surface is removed by etching (opposite surface treatment).

Figure 24A:
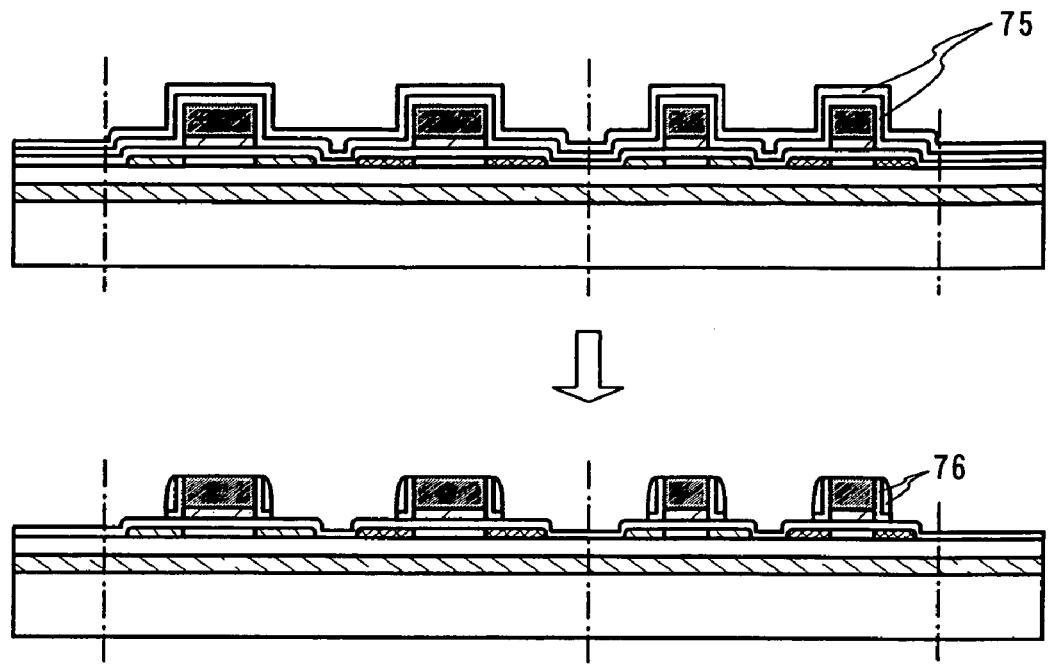
FIGS. 24A and 24B are cross sectional views showing manufacturing steps of the invention.

The forming method of the sidewall 76 is not limited to the aforementioned one. For example, methods shown in FIGS. 24A and 24B may be employed as well. FIG. 24A shows the insulating film 75 having a two or more layer structure. The insulating film 75 has, for example, a two-layer structure of a SiON (silicon oxynitride) film with a thickness of 100 nm and an LTO (Low Temperature Oxide) film with a thickness of 200 nm. In this embodiment, the SiON film is formed by plasma CVD, and the LTO film is obtained by forming a $SiO_2$ film by low pressure CVD. Then, etch back is performed thereby the sidewall 76 with an arc shape and an L shape is formed.

Figure 24B:
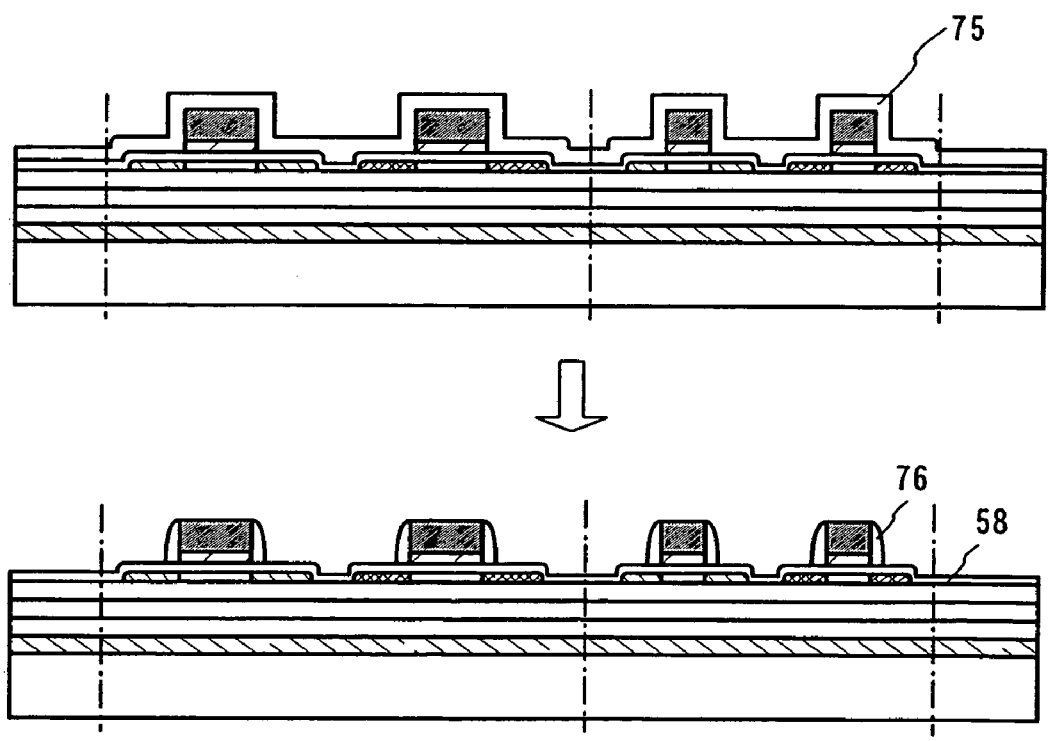

FIG. 24B shows the case where etching is performed so that the gate insulating film 58 is not removed by the etch back. The insulating film 75 in this case may be formed of a single layer or a laminated layer.

The sidewall 76 serves as a mask when an N-type impurity is doped at a high concentration in the subsequent step to form a low concentration impurity region or a non-doped offset region under the sidewall 76. In any of the aforementioned forming methods of the sidewall, the condition of the etch back may be changed depending on the width of the low-concentration impurity region or the offset region to be formed.

Figure 23C:
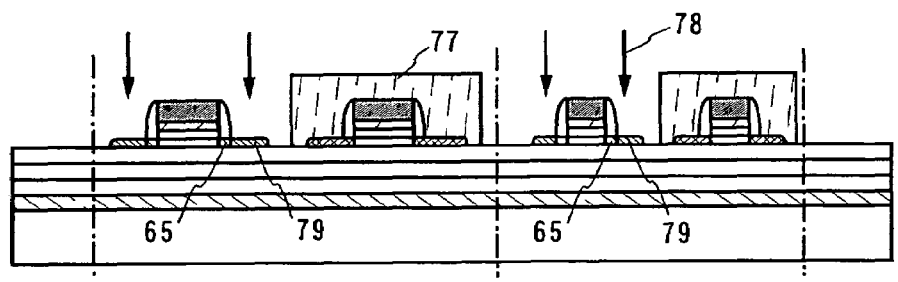

Subsequently, another resist 77 is formed so as to cover the P-channel TFT regions. An N-type impurity element 78 (typically, P or As) is doped at a high concentration with the gate electrode 56 and the sidewall 76 used as masks (a third doping step, FIG. 23C). The third doping step is performed under such conditions as a dosage of $1 \times 10^{13}$ to $5 \times 10^{15}/cm^2$ and an accelerated voltage of 60 to 100 keV. In the third doping step, through doping is performed through the gate insulating film 58 to form a couple of N-type high concentration impurity regions 79.

After the resist 77 is removed by ashing or the like, thermal activation of the impurity regions may be performed. For example, a SiON film with a thickness of 50 nm is formed, and then heat treatment is performed at a temperature of 550° C. for 4 hours in a nitrogen atmosphere. Alternatively, it is also possible that a $SiN_x$ film containing hydrogen is formed to have a thickness of 100 nm and heat treatment is performed at a temperature of 410° C. for 1 hour in a nitrogen atmosphere. According to this, defects in the crystalline semiconductor film can be improved. This step enables to terminate a dangling bond in the crystalline silicon and is called a hydrotreatment step or the like. Then, a SiON film with a thickness of 600 nm is formed as a cap insulating film for protecting the TFT. Note that the aforementioned hydrotreatment step may be performed after the formation of this SiON film. In that case, a $SiN_x$ film and a SiON film may be continuously formed. In this manner, the insulating film is formed of three layers of SiON, $SiN_x$, and SiON over the TFT, though the structure and the material are not limited to these. Note that such an insulating film is preferably formed, since it also has a function to protect the TFT.

Figure 23D:
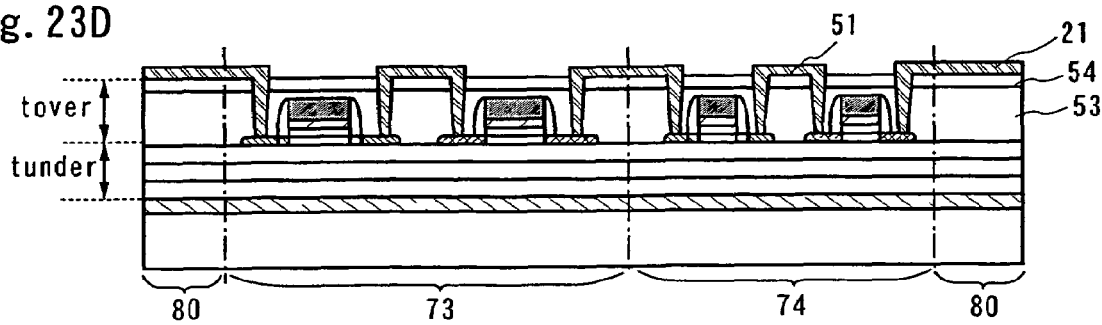

Subsequently, an interlayer film 53 is formed over the TFT (FIG. 23D). For the interlayer film 53, a heat resistant organic resin such as polyimide, acrylic, polyamide, and siloxane may be employed. The interlayer film 53 may be formed by spin coating, dipping, spray application, droplet discharge (inkjet printing, screen printing, offset printing or the like), a metering knife, a roll coater, a curtain coater, a knife coater, or the like. Alternatively, an inorganic material may be employed such as a film of silicon oxide, silicon nitride, silicon oxynitride, PSG (phosphosilicate glass), BPSG (boron phosphosilicate glass), and alumina. Note that these insulating films may be laminated to form the interlayer film 53 as well.

A protective layer 54 may be formed over the interlayer film 53. As for the protective layer 54, a film containing carbon such as DLC (Diamond Like Carbon) and carbon nitride (CN), a silicon oxide film, a silicon nitride film, a silicon nitride oxide film, or the like may be employed. The protective layer 54 may be formed by plasma CVD, atmospheric pressure plasma, or the like. Alternatively, a photosensitive or nonphotosensitive organic material such as polyimide, acrylic, polyamide, resist, and benzocyclobutene, or a heat resistant organic resin such as siloxane may be employed.

Note that a filler may be mixed into the interlayer film 53 or the protective layer 54 in order to prevent these films from being detached or cracked due to stress generated by a difference of a thermal expansion coefficient between the interlayer film 53 or the protective layer 54 and a conductive material or the like of a wiring formed later.

Then, a resist is formed and etching is performed to form contact holes, so that a wiring 51 for connecting the TFTs to each other is formed as well as a connecting wiring 21 connected to an external antenna (FIG. 23D). As for an etching gas for forming the contact holes, a mixed gas of $CHF_3$ and He is employed, though the invention is not limited to this. In addition, the wiring 51 and the connecting wiring 21 may be simultaneously formed of the same material, or may be formed separately. In this embodiment, the wiring 51 connected to the TFTs has a five-layer structure of Ti, TiN, Al—Si, Ti, and TiN that is formed by sputtering and patterning.

By mixing Si into the Al layer, hillock can be prevented from generating in the resist baking when the wiring is patterned. Instead of Si, Cu of about 0.5% may be mixed. In addition, by sandwiching the Al—Si layer between Ti and TiN, hillock resistance can be further improved. In the patterning, the aforementioned hard mask of SiON or the like is preferably employed. Note that the material and the forming method of these wirings are not limited to these, and the aforementioned material for forming the gate electrode may be employed as well.

In this embodiment, a TFT region for forming a CPU 73, a memory 74 or the like and a terminal portion 80 for connecting to an antenna are integrally formed. This embodiment can also be applied to the case where the TFT region and the antenna are integrally formed. In that case, it is preferable that the antenna be formed over the interlayer film 53 or the protective layer 54, and then covered with another protective layer. As for the conductive material of the antenna, Ag, Au, Al, Cu, Zn, Sn, Ni, Cr, Fe, Co, Ti, or an alloy containing them may be employed, though the invention is not limited to these. The wiring and the antenna may be formed of different materials from each other. Note that it is preferable that the wiring and the antenna be formed of a metal material having high ductility and malleability, and more preferably, the respective thicknesses thereof increase so as to withstand the stress due to deformation.

As for the forming method, the film may be formed over the entire surface by sputtering and patterned with a resist mask, or may be selectively formed from a nozzle by droplet discharge. The droplet discharge here includes offset printing, screen printing or the like as well as inkjet printing. The wiring and the antenna may be formed simultaneously, or may be formed separately such that one of them is formed first, and then the other is formed thereon.

Through the aforementioned steps, a thin film integrated circuit device constituted by TFTs is completed. In this embodiment, a top gate structure is employed, though a bottom gate structure (an inversely staggered structure) may be employed as well. In a region where a thin film active element such as a TFT is not formed, a base insulating film material, an interlayer insulating film material and a wiring material are mainly provided. They preferably occupy 50% or more, preferably 70 to 95% of the whole thin film integrated circuit device. According to this, the IC chip can be easily bent, thereby its completed product such as an ID label can be easily handled. In that case, it is preferable that an island shape semiconductor region (an island) of the active element including the TFT portion occupy 1 to 30%, preferably 5 to 15% of the whole thin film integrated circuit device.

In addition, as shown in FIG. 23D, the thickness of the protective layer or the interlayer film in the thin film integrated circuit device is preferably controlled so that the distance ($t_{under}$) between the semiconductor layer of the TFT and the lower protective layer may be the same or substantially the same as the distance ($t_{over}$) between the semiconductor layer and the upper interlayer film (or protective layer if formed).

By disposing the semiconductor layer in the middle of the thin film integrated circuit device in this manner, stress applied to the semiconductor layer can be alleviated, thereby generation of cracks can be prevented.

Embodiment 10

The semiconductor device of the invention can be applied to an IC card, an IC tag, an RFID, a transponder, bills, securities, a passport, an electronic apparatus, a bag, and clothes. In this embodiment, applications of an IC card, an ID tag and an ID chip are described with reference to FIGS. 18A to 18H.

Figure 18A:
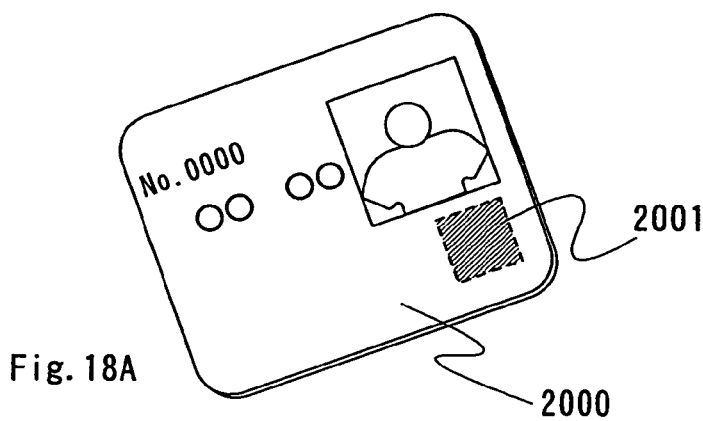
FIGS. 18A to 18H are views showing applications of the invention.

FIG. 18A shows an IC card that can be used for personal identification as well as for a credit card or electronic money that allows cashless payment by utilizing a rewritable memory circuit incorporated in the IC card. A circuit portion 2001 is incorporated in an IC card 2000.

Figure 18B:
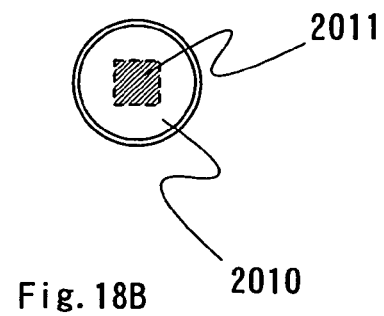

FIG. 18B shows an ID tag that can be used for personal identification as well as for access control to a specific area since it can be miniaturized. A circuit portion 2011 is incorporated in an ID tag 2010.

Figure 18C:
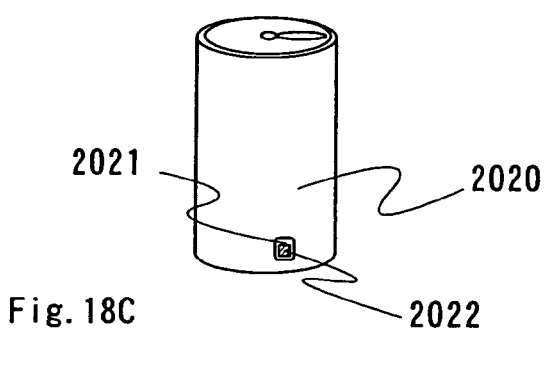

FIG. 18C shows an example of a product 2020 attached with an ID chip 2022 that is used for goods management in retail stores such as supermarkets. The invention is applied to a circuit in the ID chip 2022. By using the ID chip in this manner, stock management can be simplified and shoplifting and the like can be prevented. Although a protective film 2021 that also functions as an adhesive is used to prevent the ID chip 2022 from being peeled off in the drawing, the ID chip 2022 may be attached directly to the product 2020 with an adhesive. Further, the ID chip 2022 is preferably formed by using the flexible substrate described in Embodiment 2 in view of the structure where the ID chip 2022 is attached to the product 2020.

Figure 18D:
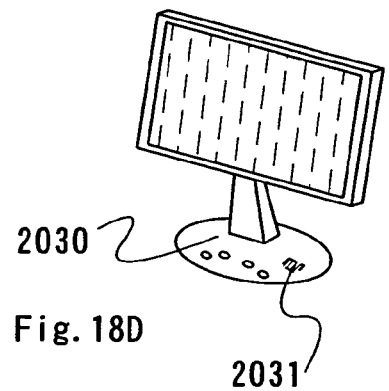

FIG. 18D shows an example of an ID chip for identification that is incorporated in a product in the manufacture thereof. In the drawing, an ID chip 2031 is incorporated in a housing 2030 of a display as an example. The invention is applied to a circuit in the ID chip 2031. Such a structure facilitates manufacture's identification, distribution management of products, and the like. Although the housing of a display is shown as an example in the drawing, the invention is not limited to this and can be applied to various electronic apparatuses and products.

Figure 18E:
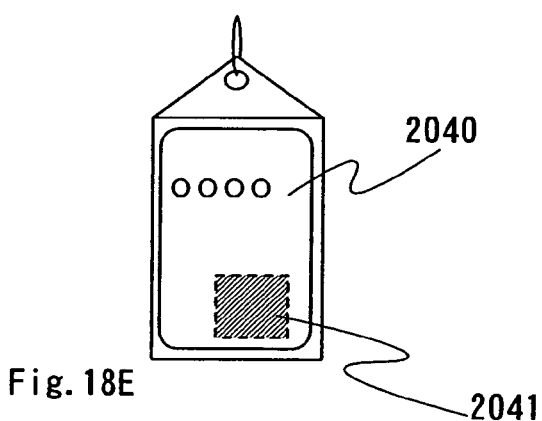

FIG. 18E shows a shipping tag for transporting objects. In the drawing, an ID chip 2041 is incorporated in a shipping tag 2040. The invention is applied to a circuit in the ID chip 2041. Such a structure facilitates selection of delivery destination, distribution management of goods and the like. Note that the shipping tag is formed so as to be attached to a string for tying an object, though the invention is not limited to this. Alternatively, the shipping tag may be directly attached to the object with a sealing member or the like.

Figure 18F:
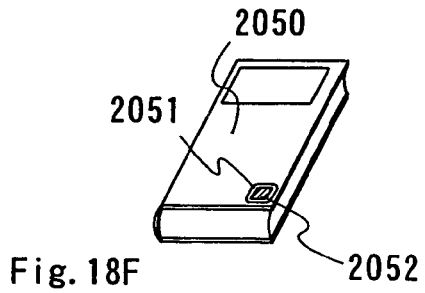

FIG. 18F shows an ID chip 2052 incorporated in a book 2050. The invention is applied to a circuit in the ID chip 2052. Such a structure facilitates distribution management in book stores, rental process in libraries, and the like. Although a protective film 2051 that also functions as an adhesive is used to prevent the ID chip 2052 from being peeled off in the drawing, the ID chip 2052 may be attached directly to the book 2050 with an adhesive or mounted inside the cover of the book 2050.

Figure 18G:
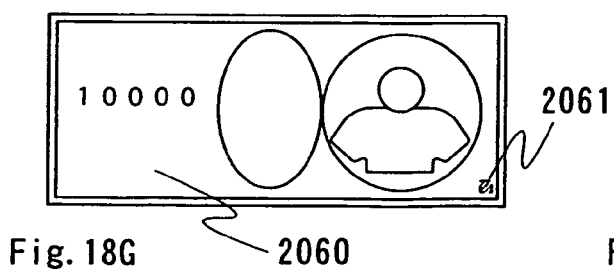

FIG. 18G shows an ID chip 2061 incorporated in a bill 2060. The invention is applied to a circuit in the ID chip 2061. Such a structure easily prevents distribution of counterfeit bills. In view of the properties of bills, it is more preferable that the ID chip 2061 be mounted inside the bill 2060 so as not to be peeled off. The invention can be applied to other paper products such as securities and a passport as well as bills.

Figure 18H:
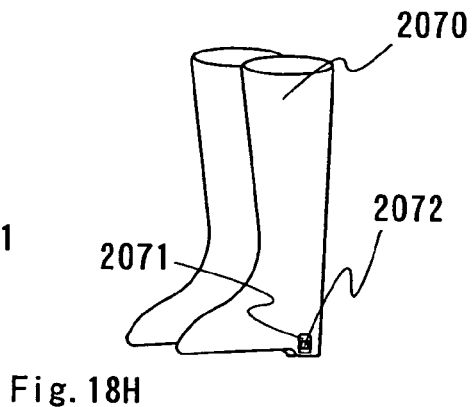

FIG. 18H shows an ID chip 2072 incorporated in a shoe 2070. The invention is applied to a circuit in an RFID chip 2072. Such a structure facilitates manufacture's identification, distribution management of products, and the like. Although a protective film 2071 that also functions as an adhesive is used to prevent the ID chip 2072 from being peeled off in the drawing, the ID chip 2072 may be attached directly to the shoe 2070 with an adhesive, or mounted inside the shoe 2070. The invention can be applied to other articles such as a bag and clothes as well as shoes.

Described hereinafter is the case where an ID chip is incorporated in various objects in order to protect the security thereof. Anti-theft security and anti-counterfeit security are essential for the security protection.

Figure 25:
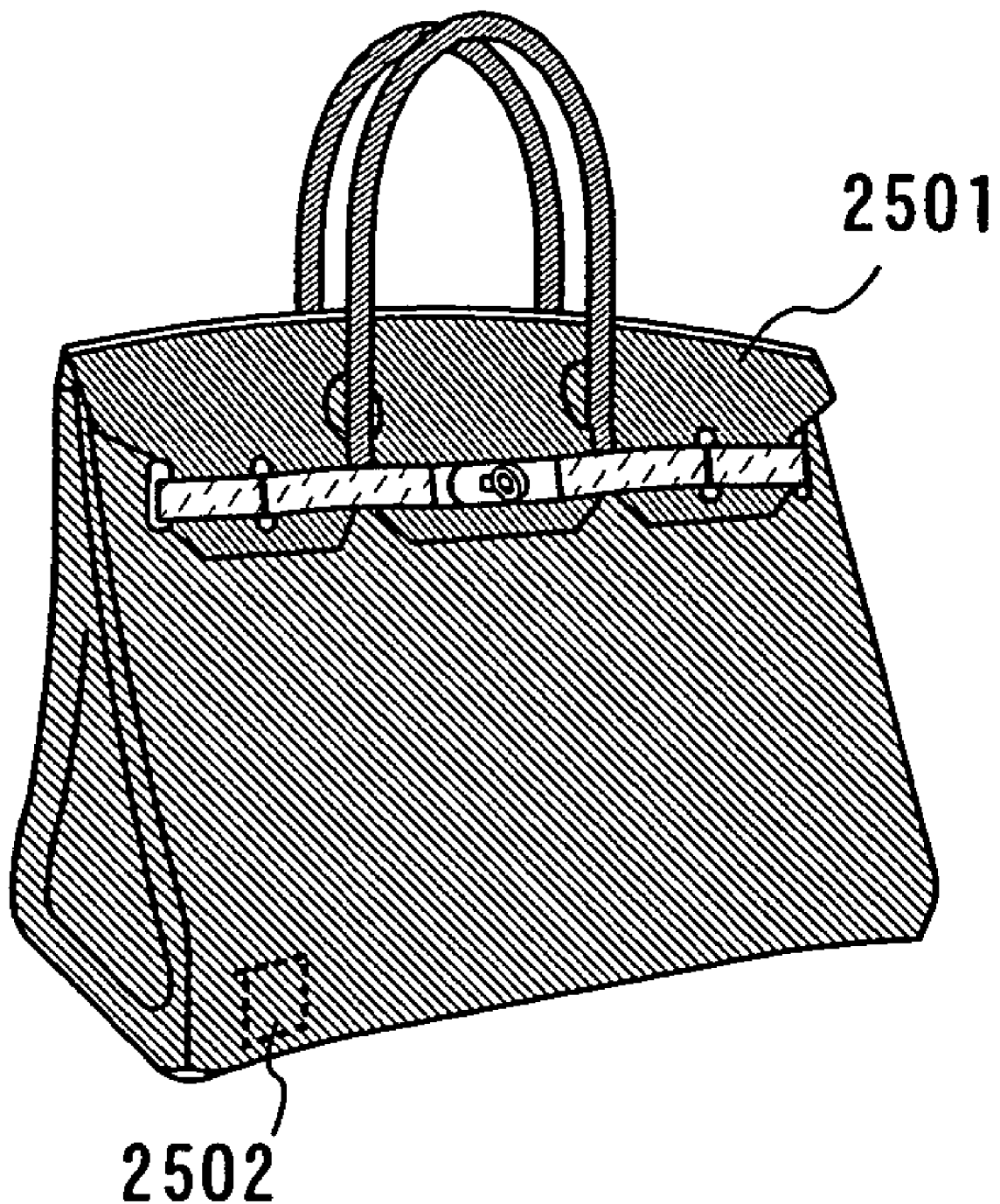
FIG. 25 is a view showing a bag using the invention.

For example, an ID chip is incorporated in a bag for anti-theft security. As shown in FIG. 25, an ID chip 2502 is incorporated in a bag 2501. The ID chip 2502 can be incorporated in the bottom or either side of the bag 2501, for example. As being extremely thin and small, the ID chip 2502 can be incorporated in the bag 2501 while maintaining an attractive design thereof. In addition, the ID chip 2502 transmits light, thus a thief cannot easily determine whether the ID chip 2502 is incorporated. Accordingly, there is no fear that the ID chip 2502 may be removed by the thief.

If such a bag incorporating the ID chip is stolen, data about the whereabouts of the bag can be obtained by using GPS (Global Positioning System), for example. Note that the GPS is a system for determining the position with the time difference between the time a signal was transmitted by a GPS satellite and the time it was received.

Besides the stolen products, the whereabouts of a lost property or a thing left behind can be determined by the GPS.

Besides the bag, the ID chip can be incorporated in a vehicle such as a car and a bicycle, a watch, and accessories.

For anti-counterfeit, an ID chip is incorporated in a passport, a driving license and the like, for example.

Figure 26A:
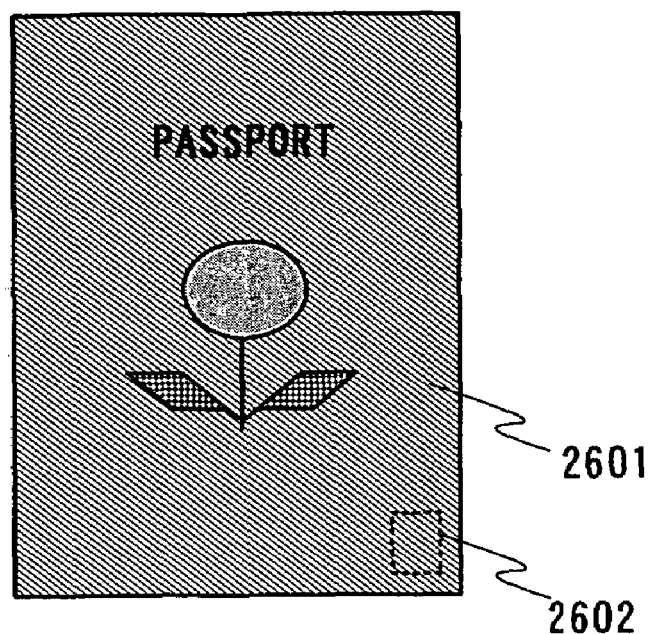
FIGS. 26A and 26B are views showing certificates using the invention.

FIG. 26A shows a passport 2601 incorporating an ID chip. Although an ID chip 2602 is incorporated in the cover of the passport 2601 in FIG. 26A, it may be incorporated in other pages. As the ID chip 2602 transmitting light, it may also be mounted on a surface of the cover. Further, the ID chip 2602 may be sandwiched between materials of the cover or the like, and then mounted inside the cover.

Figure 26B:
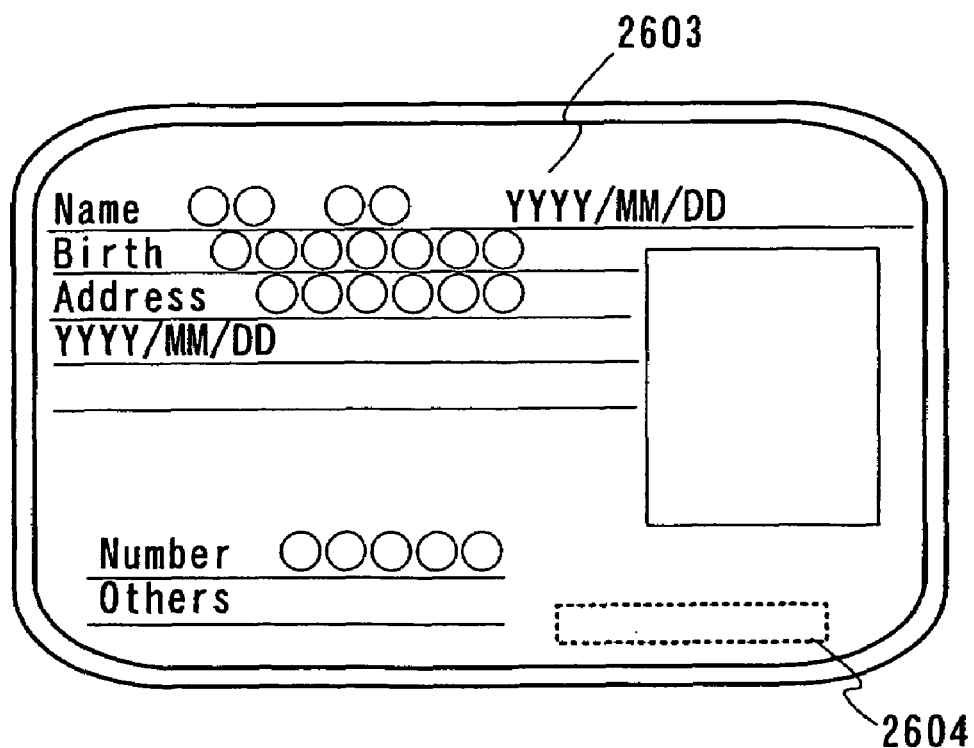

FIG. 26B shows a driving license 2603 incorporating an ID chip. In FIG. 26B, an ID chip 2604 is mounted inside the driving license 2603. Since the ID chip 2604 transmits light, it may be mounted on a printed surface of the driving license 2603. For example, the ID chip 2604 may be mounted on a printed surface of the driving license 2603 and covered with a laminate film. Alternatively, the ID chip 2604 may be sandwiched between materials of the driving license 2603 and mounted inside it.

When the ID chip is incorporated in the aforementioned objects, counterfeiting thereof can be prevented. The counterfeiting of the aforementioned bag can also be prevented by incorporating the ID chip. In addition, attractive design of the passport, the diving license and the like can be maintained since an extremely thin and small ID chip is used. Further, the ID chip, which transmits light, can be mounted on a surface of the products.

The ID chip also facilitates the management of the passport, the driving license and the like. In addition, data can be stored in the ID chip without being written directly to the passport, the driving license and the like, resulting in privacy protection.

Figure 27:
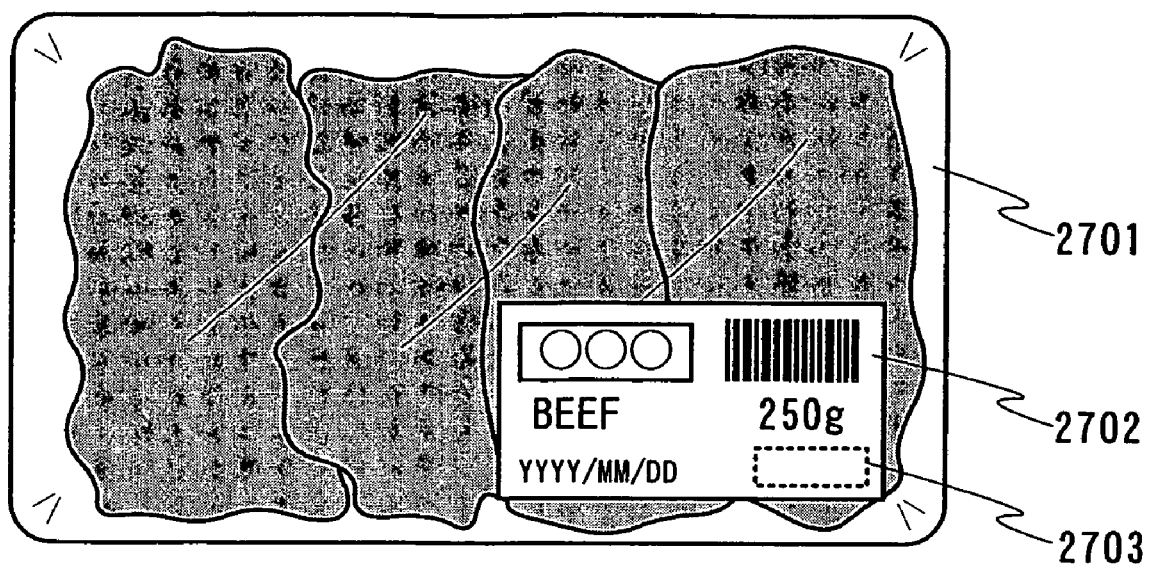
FIG. 27 is a view showing food management using the invention.

An ID chip that is incorporated in food for safety control is shown in FIG. 27.

FIG. 27 shows a display label 2702 incorporating an ID chip 2703, which is attached to a pack of meat 2701. The ID chip 2703 may be mounted on a surface of or inside the display label 2702. The ID chip may also be mounted on a cellophane for wrapping fresh food such as vegetables.

The ID chip 2703 can store basic data of a product such as a production area, a producer, a processing date, and a use-by date, as well as additional data such as a serving suggestion for the product. The basic data, which is not required to be rewritten, may be stored in a non-rewritable memory such as an MROM. Meanwhile, the additional data may be stored in a rewritable and erasable memory such as an EEPROM.

For safety control of food, it is important to obtain data of plants and animals that are not yet processed. In order to this, an ID chip may be incorporated in plants and animals and data thereof may be obtained by a reader device. The data of plants and animals includes a breeding area, a feed, a breeder, presence and absence of infection, and the like.

When the price of a product is stored in the ID chip, the product can be paid more simply and in a shorter time than the case of a conventional bar code being used. That is, a plurality of products each incorporating the ID chip can be paid at a time. In the case of reading a plurality of ID chips, however, a reader device is required to be equipped with anti-collision function.

Further, depending on communication distance of the ID chip, the products can be paid at the cash register even when there is a distance between the products and the cash register, and shoplifting and the like can also be prevented.

The ID chip can be used in combination with other information media such as bar code and magnetic tape. For example, basic data that is not required to be rewritten may be stored in the ID chip whereas data to be rewritten such as discount price and bargain information may be stored in the bar code. The data of the bar code can be easily modified unlike that of the ID chip.

As set forth above, incorporation of the ID chip increases the amount of information given to consumers, thus they can purchase products at ease.

Figure 28A:
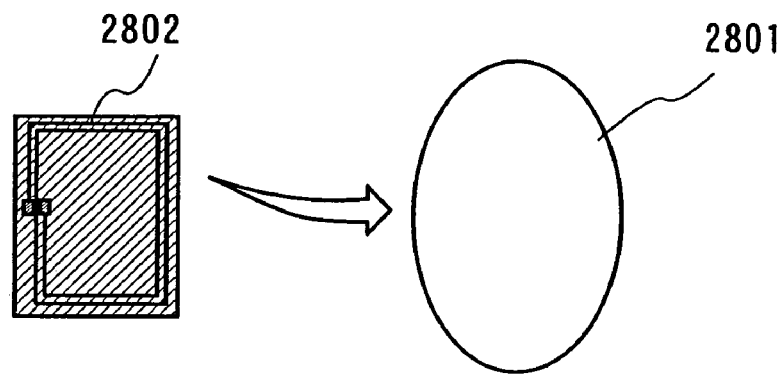
FIGS. 28A and 28B are views showing distribution management using the invention.

Described next is the case of incorporating an ID chip in products such as a beer bottle for distribution management. As shown in FIG. 28A, an ID chip 2802 is incorporated in a beer bottle using, for example, a label 2801.

Figure 28B:
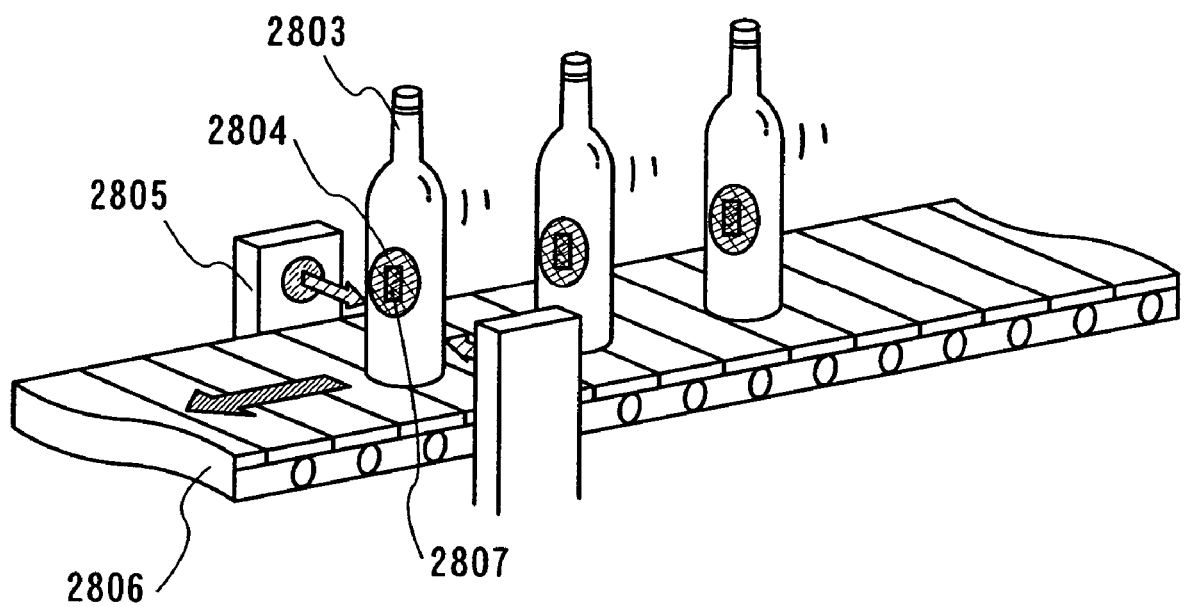

The ID chip 2802 stores basic data such as a manufacturing date, a manufacturing area and used ingredients. Such basic data is not required to be rewritten, thus it may be stored in a non-rewritable memory such as an MROM. The ID chip also stores individual data such as a delivery address and a delivery date. For example, as shown in FIG. 28B, when each beer bottle 2803 moving on a conveyor belt 2806 passes a writer device 2805, each delivery address and delivery date can be stored in an ID chip 2807 incorporated in a label 2804. Such individual data may be stored in a rewritable and erasable memory such as an EEPROM.

A system is preferably configured such that when data of a purchased product is transmitted from a delivery destination to a distribution management center via a network, the delivery address and date are calculated by the writer device 2805, a personal computer for controlling the writer device 2805, or the like, and then stored in the ID chip.

Since the bottles are delivered per case, the ID chip may be incorporated in each case or every several cases to store individual data.

When the ID chip is incorporated in such drinks for storing a plurality of delivery addresses, the time required for manual data input can be reduced, which results in reduced input error. In addition, it is possible to lower labor costs that are the most costly expenses in the distribution management. Thus, incorporation of the ID chip allows the distribution management to be performed with few errors at low cost.

Further, additional data such as food that is good with beer and a recipe with beer may be stored at the delivery destination. As a result, the food and the like can be promoted and consumers' willingness to buy can be increased. Such additional data may be stored in a rewritable and erasable memory such as an EEPROM. In this manner, incorporation of the ID chip increases the amount of information given to consumers, thus they can purchase products at ease.

A product incorporating an ID chip for manufacturing management is described as well as a manufacturing apparatus (manufacturing robot) controlled based on data of the ID chip.

In recent years, original products are often manufactured, and they are manufactured on a production line based on its original data. For example, in a production line of cars that can provide free color choice of doors, an ID chip is incorporated in a part of each car and a painting apparatus is controlled based on the data of the ID chip. Accordingly, an original car can be manufactured.

When the ID chip is incorporated, there is no need to control the order and color of cars to be put into a production line in advance. Therefore, it is not necessary to set a program for controlling a painting apparatus in accordance with the order and number of cars. That is, a manufacturing apparatus can operate individually based on data of the ID chip incorporated in each car.

As set forth above, the ID chip can be applied to various fields. Based on the data stored in the ID chip, individual manufacturing data can be obtained and the manufacturing apparatus can be controlled based on the individual data.

Figure 29:
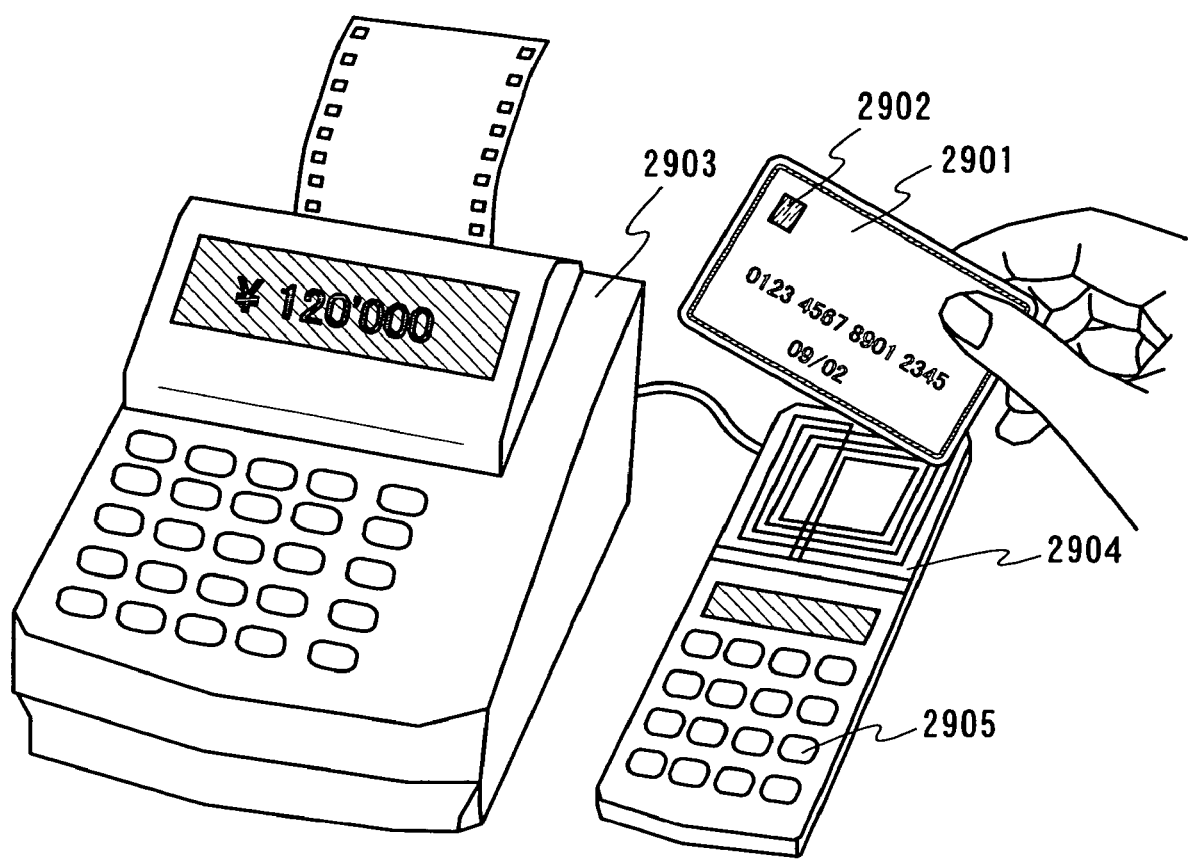
FIG. 29 is a view showing payment by IC card using the invention.

Described hereinafter is an IC card incorporating the ID chip of the invention, which is used as electronic money. In FIG. 29, an IC card 2901 is used to make payment. The IC card 2901 incorporates an ID chip 2902 of the invention. A cash register 2903 and a reader/writer 2904 are needed for using the IC card 2901. The ID chip 2902 stores data of the amount available on the IC card 2901, and the data of the amount can be read wirelessly by the reader/writer 2904 and transmitted to the cash register 2903. The cash register 2903 verifies that the amount to be paid is available on the IC card 2901, and then payment is made. Subsequently, data of remainder of the money after the payment is transmitted to the reader/writer 2904, and written to the ID chip 2902 of the IC card 2901 by the reader/writer 2904.

Note that the reader/writer 2904 may be equipped with a key 2905 for inputting a personal identification number and the like, thereby the IC card 2901 can be prevented from being used by a third party without notice.

The application shown in this embodiment is just an example, and the invention is not limited to this.

As set forth above, the application range of the invention is so wide that the ID chip of the invention can be applied for identification of all products. In addition, this embodiment can be implemented in combination with Embodiment Mode and Embodiments 1 to 10.

This application is based on Japanese Patent Application serial No. 2004-034845 filed in Japan Patent Office on Feb. 12, 2004, the contents of which are hereby incorporated by reference.

What is claimed is:

1. A semiconductor device comprising:
a modulation circuit, a demodulation circuit, a logic circuit, a nonvolatile memory circuit, a level shift circuit, a control circuit, and an antenna circuit, which are formed over an insulating substrate,
wherein the modulation circuit and the demodulation circuit are electrically connected to the antenna circuit,
wherein the demodulation circuit is connected to the logic circuit,
wherein the logic circuit is connected to the control circuit and the level shift circuit,
wherein a signal inputted from the antenna circuit is operated by the logic circuit and inputted to the level shift circuit,
wherein the nonvolatile memory circuit includes means for storing an output signal of the level shift circuit,
wherein the nonvolatile memory circuit is for storing data by charge injection,
wherein the control circuit writes data to the nonvolatile memory circuit only once, and
wherein the nonvolatile memory circuit writes data in accordance with the instruction of the control circuit and the level shift circuit.

2. The semiconductor device according to claim 1, wherein an element constituting the nonvolatile memory circuit stores data by charge injection into a floating gate.

3. The semiconductor device according to claim 1, wherein an element constituting the nonvolatile memory circuit stores data by charge injection into a gate insulating film.

4. The semiconductor device according to claim 1, wherein a power supply used by the nonvolatile memory circuit for storing data is obtained by rectifying and boosting the signal outputted from the antenna circuit.

5. The semiconductor device according to claim 1, wherein a power supply used by the nonvolatile memory circuit for storing data is obtained from an external high voltage power supply.

6. The semiconductor device according to claim 1, wherein at least one of the modulation circuit, the demodulation circuit, the logic circuit, and the nonvolatile memory circuit is constituted by a thin film transistor.

7. The semiconductor device according to claim 1, wherein the insulating substrate is selected from the group consisting of a glass substrate, a plastic substrate and a film insulator.

8. The semiconductor device according to claim 1, wherein the antenna circuit is formed over at least one of the modulation circuit, the demodulation circuit, the logic circuit, and the nonvolatile memory circuit.

9. The semiconductor device according to claim 1, wherein a signal inputted to the antenna circuit is a wireless signal.

10. A product having the semiconductor device according to claim 1, wherein the product is selected from the group consisting of an IC card, an IC tag, an RFID, a transponder, a bill, a security, a passport, an electronic apparatus, a bag, and clothes.

11. The semiconductor device according to claim 1, wherein a thin film transistor in the logic circuit and a thin film transistor in the nonvolatile memory circuit are formed simultaneously.

12. The semiconductor device according to claim 1, wherein the logic circuit includes at least a switch and a volatile memory circuit.

13. The semiconductor device according to claim 12, wherein in the case of the switch is on, the signal is outputted to the level shift circuit.

14. The semiconductor device according to claim 1, wherein the control circuit writes only first data to the nonvolatile memory circuit.

15. A semiconductor device comprising:
a modulation circuit, a demodulation circuit, a logic circuit, a nonvolatile memory circuit, a level shift circuit, a control circuit, and an antenna circuit, which are formed over an insulating substrate,
wherein the modulation circuit and the demodulation circuit are electrically connected to the antenna circuit,
wherein the demodulation circuit is connected to the logic circuit,
wherein the logic circuit is connected to the control circuit and the level shift circuit,
wherein a signal inputted from the antenna circuit is operated by the logic circuit and inputted to the level shift circuit,
wherein the nonvolatile memory circuit includes means for storing an output signal of the level shift circuit,
wherein the nonvolatile memory circuit is for storing data by charge injection,
wherein the control circuit controls whether data can be written to the nonvolatile memory circuit or not depending on the data stored in the nonvolatile memory circuit, and
wherein the nonvolatile memory circuit writes data in accordance with the instruction of the control circuit and the level shift circuit.

16. The semiconductor device according to claim 15, wherein an element constituting the nonvolatile memory circuit stores data by charge injection into a floating gate.

17. The semiconductor device according to claim 15, wherein an element constituting the nonvolatile memory circuit stores data by charge injection into a gate insulating film.

18. The semiconductor device according to claim 15, wherein a power supply used by the nonvolatile memory circuit for storing data is obtained by rectifying and boosting the signal outputted from the antenna circuit.

19. The semiconductor device according to claim 15, wherein a power supply used by the nonvolatile memory circuit for storing data is obtained from an external high voltage power supply.

20. The semiconductor device according to claim 15, wherein at least one of the modulation circuit, the demodulation circuit, the logic circuit, and the nonvolatile memory circuit is constituted by a thin film transistor.

21. The semiconductor device according to claim 15, wherein the insulating substrate is selected from the group consisting of a glass substrate, a plastic substrate and a film insulator.

22. The semiconductor device according to claim 15, wherein the antenna circuit is formed over at least one of the modulation circuit, the demodulation circuit, the logic circuit, and the nonvolatile memory circuit.

23. The semiconductor device according to claim 15, wherein a signal inputted to the antenna circuit is a wireless signal.

24. A product having the semiconductor device according to claim 15, wherein the product is selected from the group consisting of an IC card, an IC tag, an RFID, a transponder, a bill, a security, a passport, an electronic apparatus, a bag, and clothes.

25. The semiconductor device according to claim 15, wherein a thin film transistor in the logic circuit and a thin film transistor in the nonvolatile memory circuit are formed simultaneously.

26. The semiconductor device according to claim 15, wherein the logic circuit includes at least a switch and a volatile memory circuit.

27. The semiconductor device according to claim 26, wherein in the case of the switch is on, the signal is outputted to the level shift circuit.

28. The semiconductor device according to claim 15, wherein the control circuit writes only first data to the nonvolatile memory circuit.

29. A semiconductor device comprising:
an antenna circuit;
a modulation circuit electrically connected to the antenna circuit;
a demodulation circuit electrically connected to the antenna circuit;
a logic circuit electrically connected to the demodulation circuit;
a nonvolatile memory circuit having means for storing an output signal of the logic circuit and for storing data by charge injection;
a control circuit capable of writing data to the nonvolatile memory circuit only once, and
a level shift circuit electrically connected to the nonvolatile memory circuit,
wherein the logic circuit is connected to the control circuit and the level shift circuit,
wherein a signal inputted from the antenna circuit is operated by the logic circuit and inputted to the level shift circuit, and
wherein the nonvolatile memory circuit writes data in accordance with the instruction of the control circuit and the level shift circuit.

30. The semiconductor device according to claim 29, wherein an element constituting the nonvolatile memory circuit stores data by charge injection into a floating gate.

31. The semiconductor device according to claim 29, wherein an element constituting the nonvolatile memory circuit stores data by charge injection into a gate insulating film.

32. The semiconductor device according to claim 29, wherein a power supply used by the nonvolatile memory circuit for storing data is obtained by rectifying and boosting the signal outputted from the antenna circuit.

33. The semiconductor device according to claim 29, wherein a power supply used by the nonvolatile memory circuit for storing data is obtained from an external high voltage power supply.

34. The semiconductor device according to claim 29, wherein at least one of the modulation circuit, the demodulation circuit, the logic circuit, and the nonvolatile memory circuit is constituted by a thin film transistor.

35. The semiconductor device according to claim 29, wherein the insulating substrate is selected from the group consisting of a glass substrate, a plastic substrate and a film insulator.

36. The semiconductor device according to claim 29, wherein the antenna circuit is formed over at least one of the modulation circuit, the demodulation circuit, the logic circuit, and the nonvolatile memory circuit.

37. The semiconductor device according to claim 29, wherein a signal inputted to the antenna circuit is a wireless signal.

38. A product having the semiconductor device according to claim 29, wherein the product is selected from the group consisting of an IC card, an IC tag, an REID, a transponder, a bill, a security, a passport, an electronic apparatus, a bag, and clothes.

39. The semiconductor device according to claim 29, wherein a thin film transistor in the logic circuit and a thin film transistor in the nonvolatile memory circuit are formed simultaneously.

40. The semiconductor device according to claim 29, wherein the logic circuit includes at least a switch and a volatile memory circuit.

41. The semiconductor device according to claim 40, wherein in the case of the switch is on, the signal is outputted to the level shift circuit.

42. The semiconductor device according to claim 29, wherein the control circuit writes only first data to the nonvolatile memory circuit.

* * * * *